US011810960B2

(12) United States Patent
Wang et al.

(10) Patent No.: US 11,810,960 B2
(45) Date of Patent: Nov. 7, 2023

(54) CONTACT STRUCTURES IN SEMICONDUCTOR DEVICES

(71) Applicant: Taiwan Semiconductor Manufacturing Co., Ltd., Hsinchu (TW)

(72) Inventors: Sung-Li Wang, Zhubei (TW); Hsu-Kai Chang, Hsinchu (TW); Jhih-Rong Huang, Hsinchu (TW); Yen-Tien Tung, Hsinchu (TW); Chia-Hung Chu, Taipei (TW); Tzer-Min Shen, Hsinchu (TW); Pinyen Lin, Rochester, NY (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/197,892

(22) Filed: Mar. 10, 2021

(65) Prior Publication Data
US 2022/0037500 A1 Feb. 3, 2022

Related U.S. Application Data

(60) Provisional application No. 63/059,544, filed on Jul. 31, 2020.

(51) Int. Cl.
*H01L 29/45* (2006.01)
*H01L 21/285* (2006.01)
(Continued)

(52) U.S. Cl.
CPC ........ *H01L 29/45* (2013.01); *H01L 21/28518* (2013.01); *H01L 21/823418* (2013.01);
(Continued)

(58) Field of Classification Search
CPC .............. H01L 29/45; H01L 21/28518; H01L 29/7839
See application file for complete search history.

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

CN 106206303 B 9/2019

OTHER PUBLICATIONS

Extended European Search Report, for European Patent Appl. No. 21188772.4, 10 pages, dated Mar. 22, 2022.

*Primary Examiner* — Farun Lu
(74) *Attorney, Agent, or Firm* — Sterne, Kessler, Goldstein & Fox. P.L.L.C.

(57) ABSTRACT

A semiconductor device with different configurations of contact structures and a method of fabricating the same are disclosed. The semiconductor device includes a substrate, a fin structure disposed on the substrate, a gate structure disposed on the fin structure, a source/drain (S/D) region disposed adjacent to the gate structure, a contact structure disposed on the S/D region, and a dipole layer disposed at an interface between the ternary compound layer and the S/D region. The contact structure includes a ternary compound layer disposed on the S/D region, a work function metal (WFM) silicide layer disposed on the ternary compound layer, and a contact plug disposed on the WFM silicide layer.

20 Claims, 32 Drawing Sheets

(51) Int. Cl.
*H01L 29/08* (2006.01)
*H01L 29/417* (2006.01)
*H01L 29/66* (2006.01)
*H01L 29/78* (2006.01)
*H01L 21/8234* (2006.01)

(52) U.S. Cl.
CPC .... *H01L 29/0847* (2013.01); *H01L 29/41791* (2013.01); *H01L 29/66795* (2013.01); *H01L 29/7839* (2013.01); *H01L 29/7851* (2013.01)

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2009/0134388 A1 | 5/2009 | Yamauchi |
| 2009/0280641 A1* | 11/2009 | Kang .............. H01L 21/76843 438/653 |
| 2014/0065799 A1 | 3/2014 | Ahmed |
| 2016/0197075 A1* | 7/2016 | Li .................. H01L 21/823807 257/369 |
| 2017/0365527 A1 | 12/2017 | Zhou et al. |
| 2018/0006140 A1 | 1/2018 | Fronheiser et al. |
| 2018/0130704 A1* | 5/2018 | Li .................... H01L 21/28052 |
| 2018/0175159 A1 | 6/2018 | Lin et al. |
| 2019/0067013 A1* | 2/2019 | Wang .............. H01L 29/41791 |

* cited by examiner

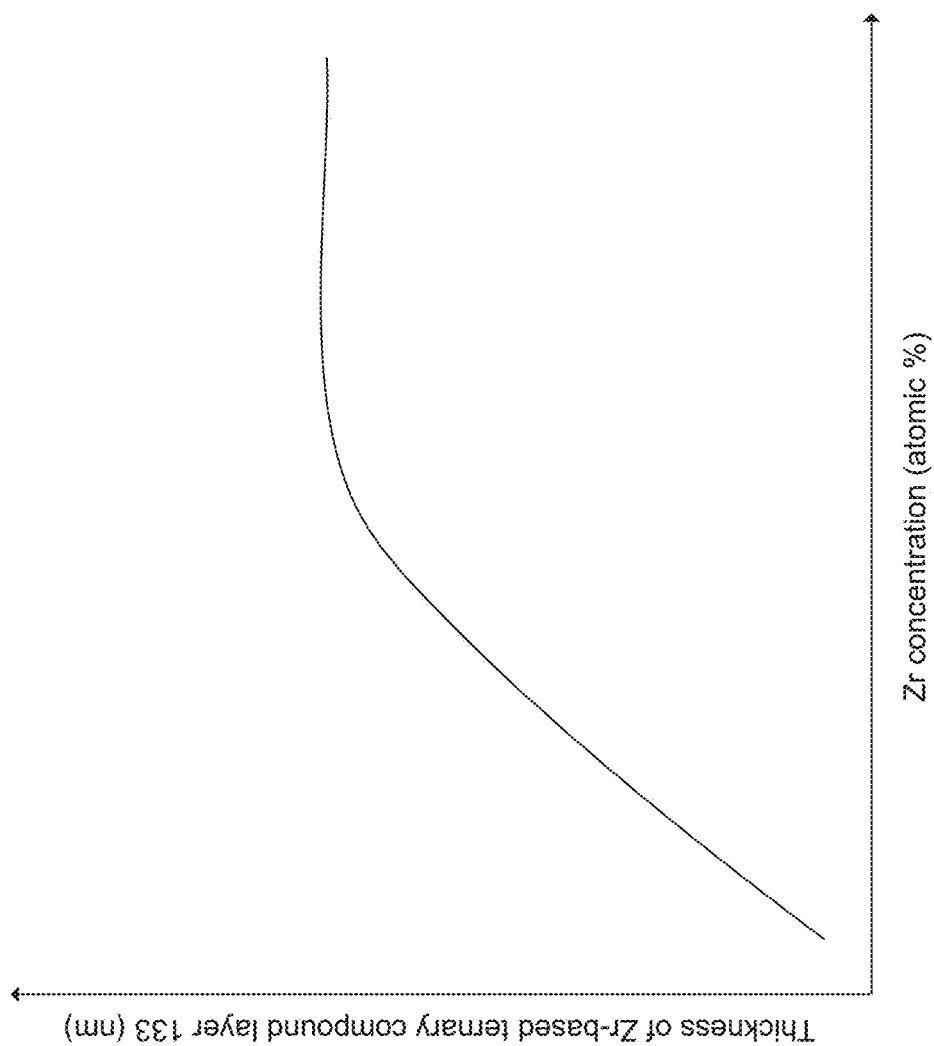

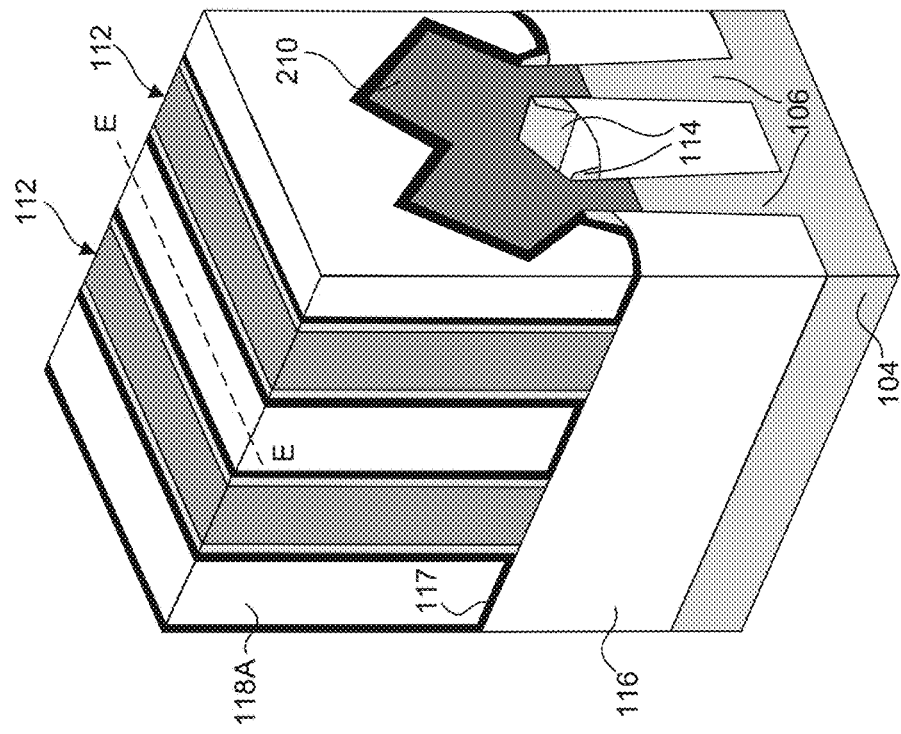
Fig. 2A

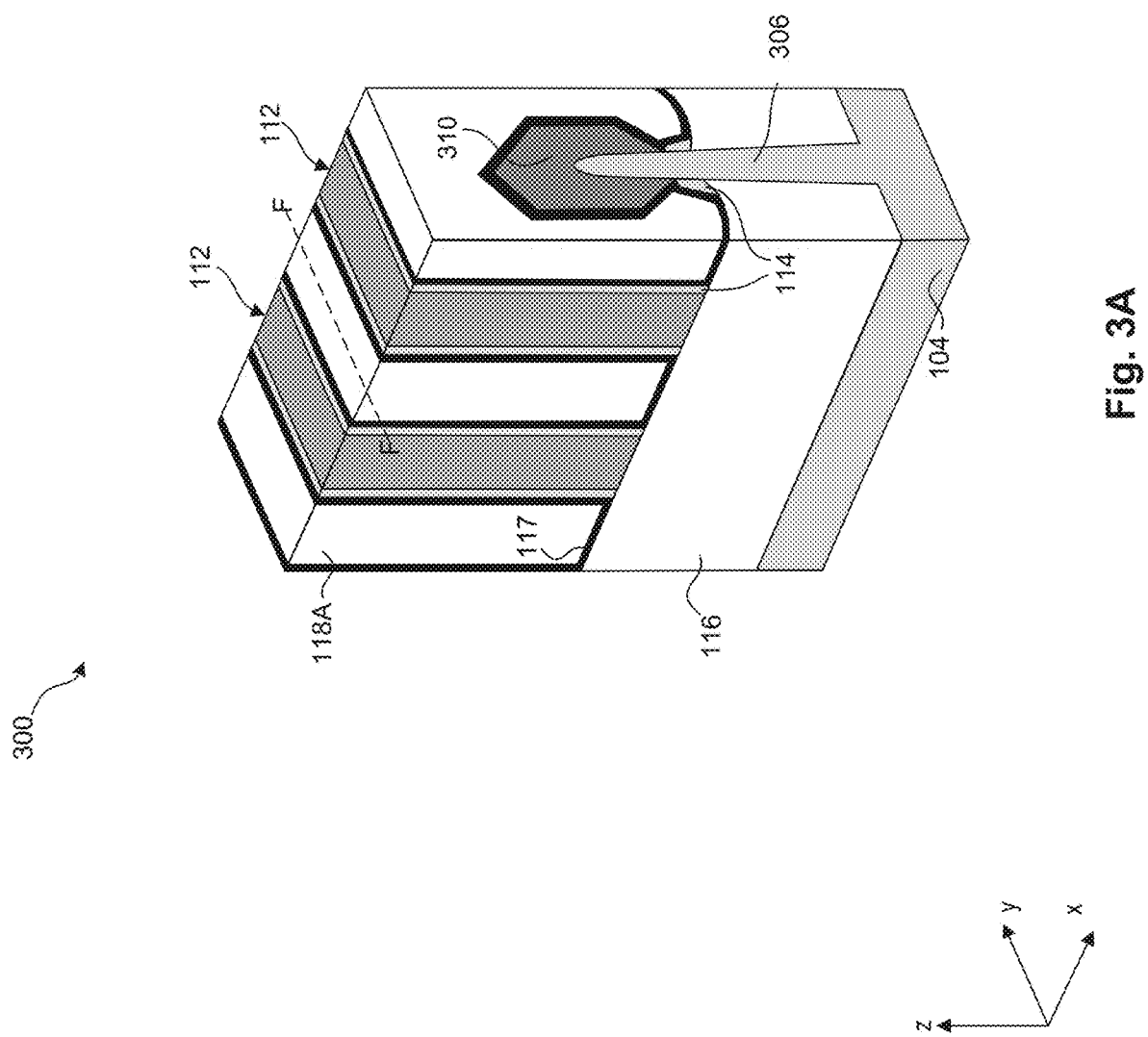

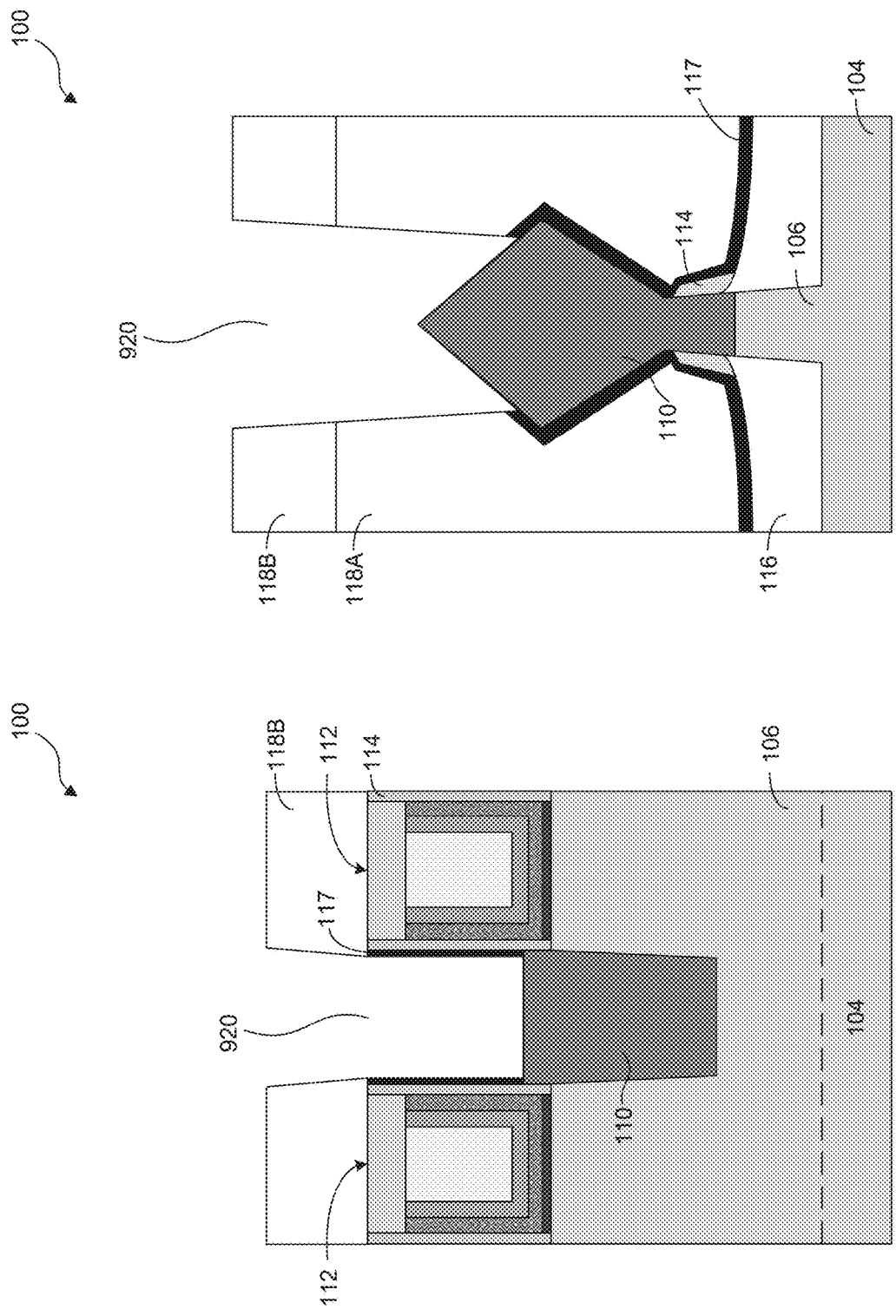

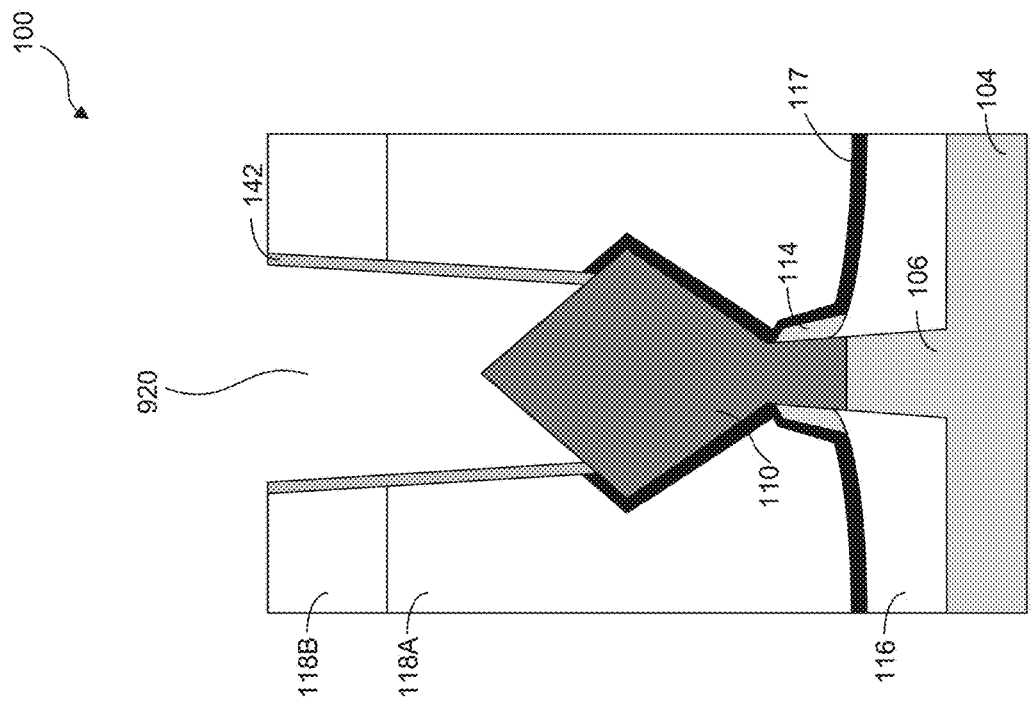
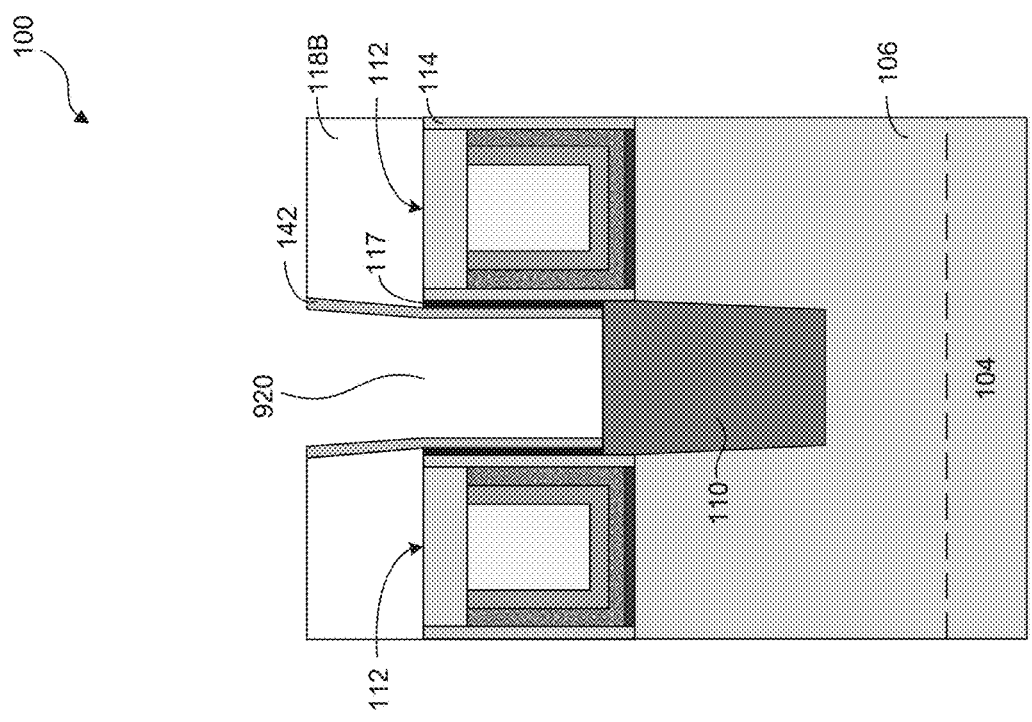

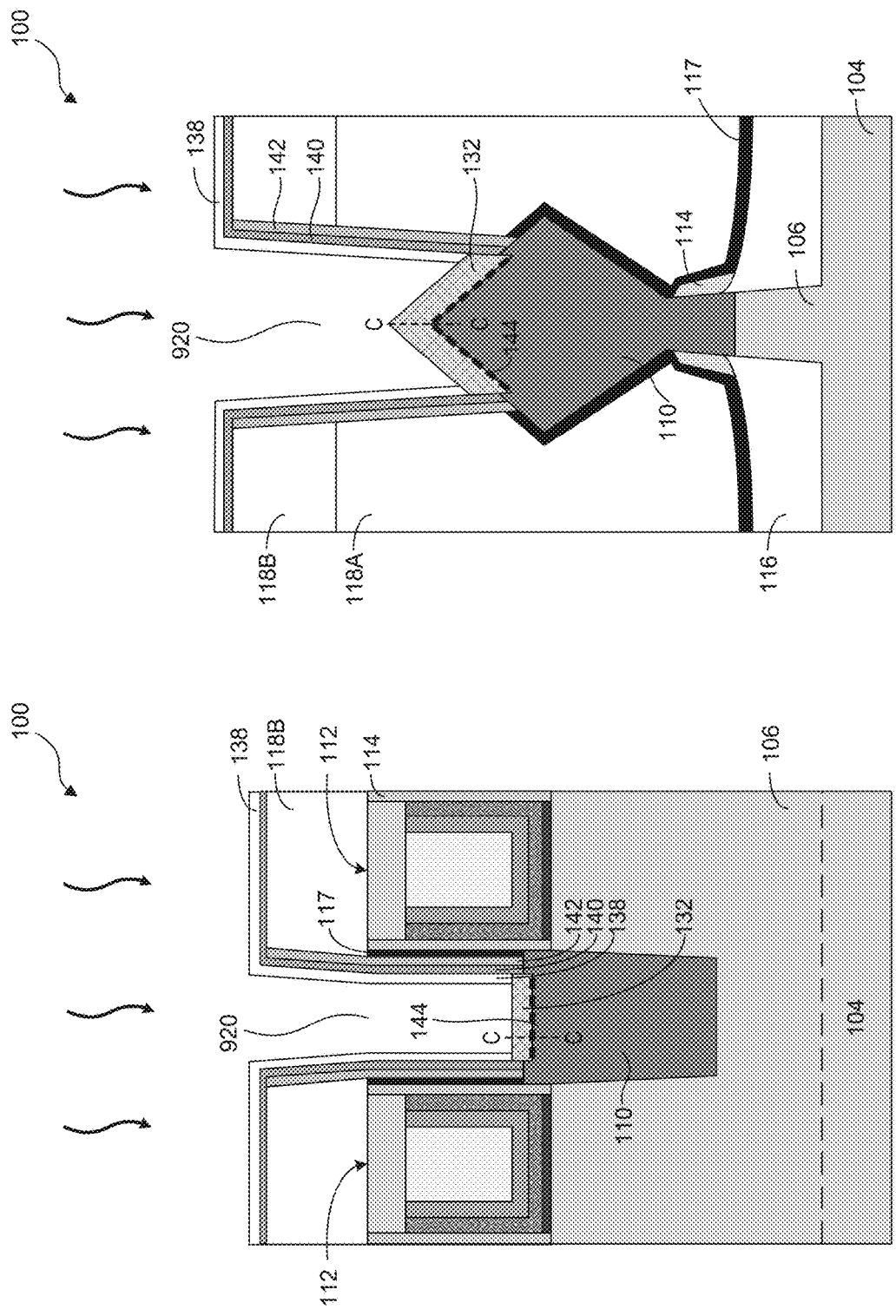

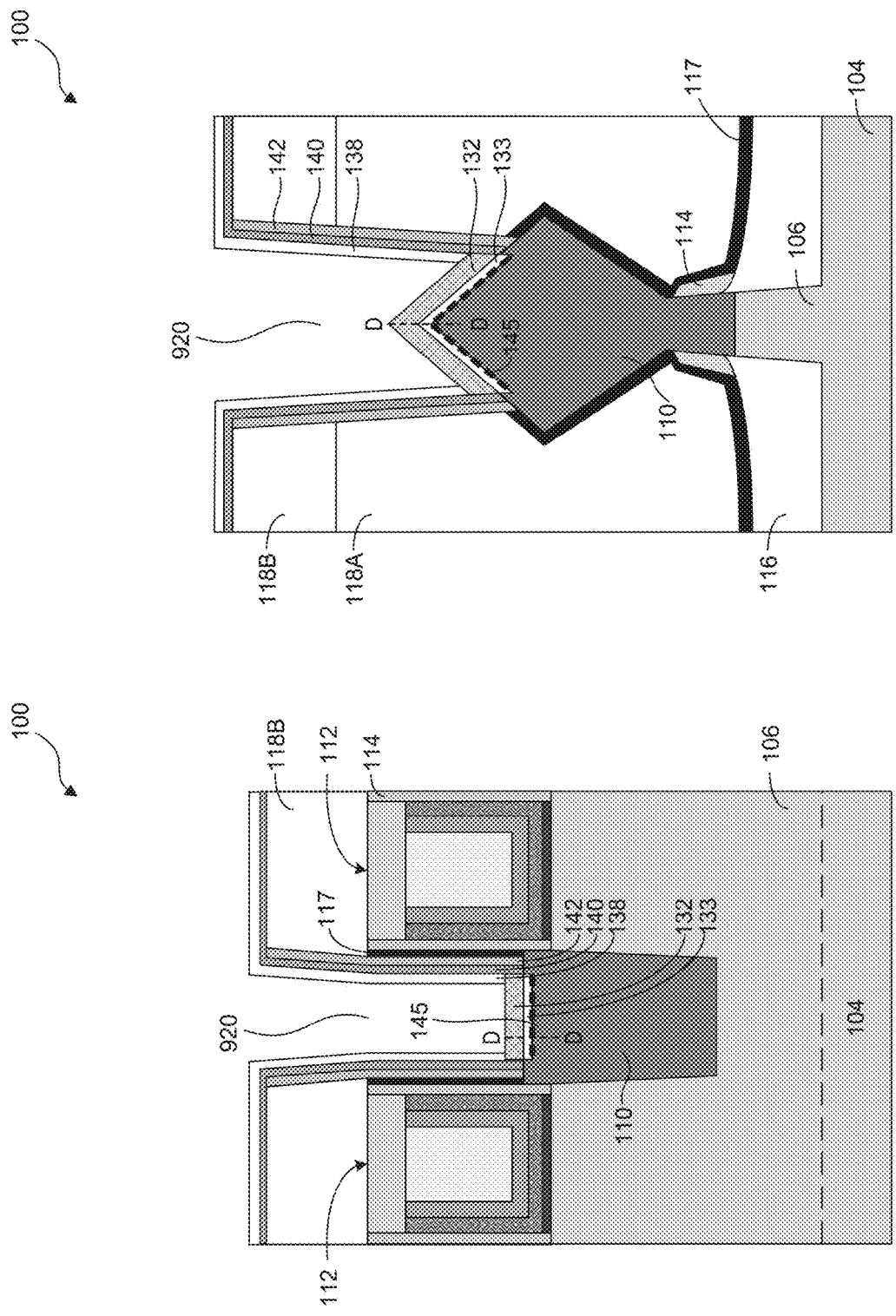

CONTACT STRUCTURES IN SEMICONDUCTOR DEVICES

CROSS-REFERENCE TO RELATED APPLICATIONS

This application claims the benefit of U.S. Provisional Patent Application No. 63/059,544, titled "Semiconductor Structure and Method for Forming the Same," filed Jul. 31, 2020, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 1J-1L illustrate device characteristics of a semiconductor device with contact structures, in accordance with some embodiments.

FIGS. 2A-2E illustrate an isometric view and cross-sectional views of a semiconductor device, in accordance with some embodiments.

FIGS. 3A-3G illustrate an isometric view and cross-sectional views of a semiconductor device, in accordance with some embodiments.

FIGS. 6A-17B illustrate cross-sectional views of a semiconductor device with contact structures at various stages of its fabrication process, in accordance with some embodiments.

Figure 1A:
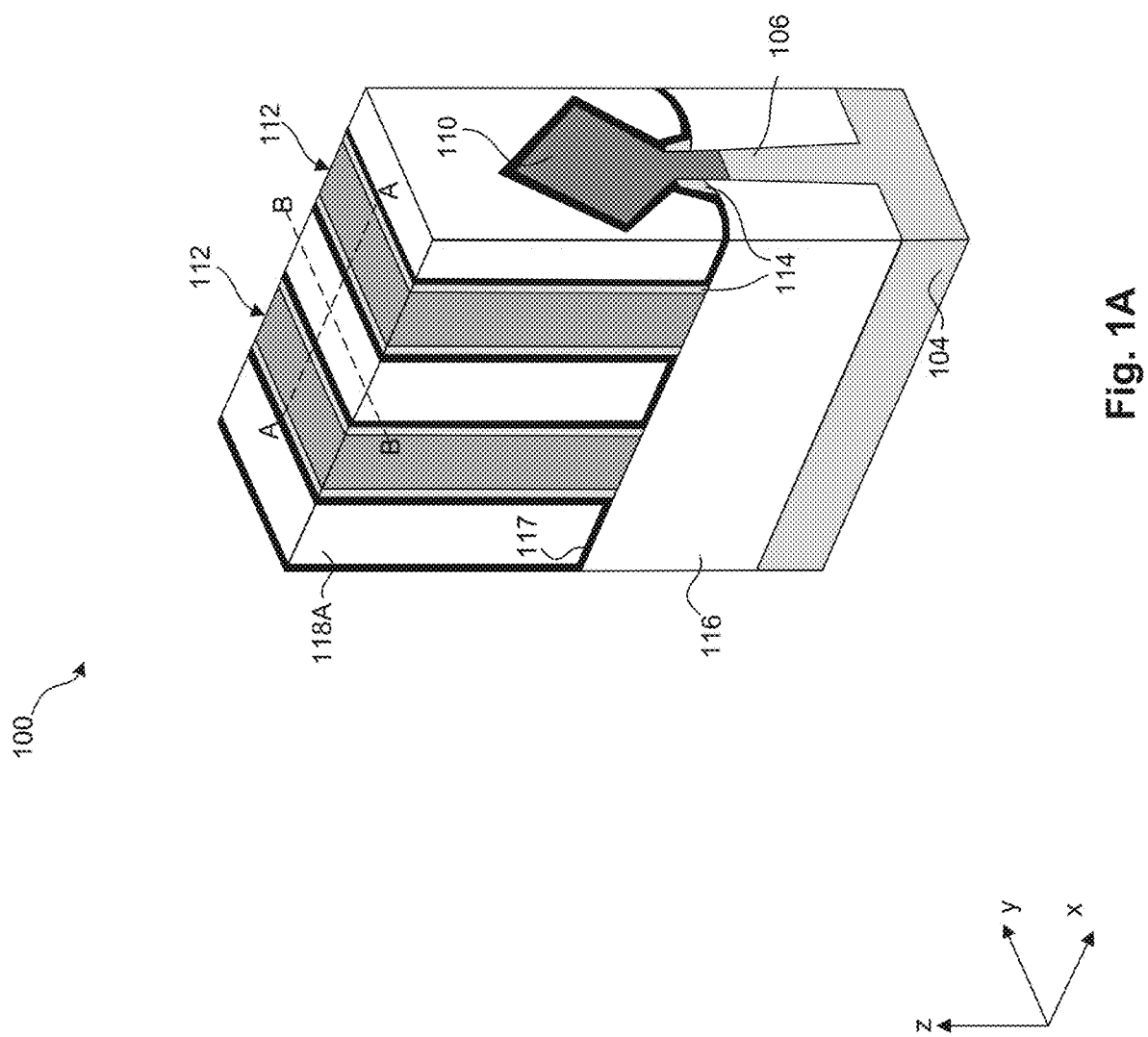
FIGS. 1A-1I illustrate an isometric view and cross-sectional views of a semiconductor device, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example structures and methods for reducing contact resistance between source/drain (S/D) regions and S/D contact structures of FETs (e.g. finFETs, gate-all-around (GAA) FETs, etc.). The contact resistances between the S/D regions and the S/D contact structures are directly proportional to the Schottky barrier heights (SBHs) between the materials of the S/D regions and the silicide layers of the S/D contact structures. Reducing the difference between the work function value of the silicide layers and the material of the S/D regions can reduce the SBH between the S/D regions and the S/D contact structures. In some embodiments, since the S/D regions of NFETs and PFETs are formed with respective n-type and p-type materials, the S/D contact structures of NFETs and PFETs are formed with silicide layers different from each other to reduce the contact resistances between the S/D contact structures and the different materials of the S/D regions.

In some embodiments, dipole layers and/or ternary compound layers can be formed at interfaces between the S/D regions and the silicide layers to further reduce the SBHs between the S/D regions and the S/D contact structures. The dipole layers and/or ternary compound layers can be formed by doping the silicide layers with metals having electronegativity values lower than the metals of the silicide layers. The metal dopants can induce the formation of dipoles between the metal dopants and the semiconductor elements of the S/D regions. The metal dopants can also induce the formation of a ternary compound between the metal dopants, the metal of the silicide layers, and the semiconductor elements of the S/D regions. The formation of such interfacial dipole layers and/or ternary compound layers can reduce the contact resistances of the FETs by about 50% to about 70% compared to FETs without the interfacial dipole layers and/or ternary compound layers, and consequently improve the performance of the FETs.

FIG. 1A illustrates an isometric view of a FET 100, according to some embodiments. FET 100 can have different cross-sectional views, as illustrated in FIGS. 1B-1I, according to some embodiments. FIGS. 1B, 1D, 1F, and 1H illustrate cross-sectional views of FET 100 along line A-A, and FIGS. 1C, 1E, 1G, and 1I illustrate cross-sectional views along line B-B of FIG. 1A with additional structures that are not shown in FIG. 1A for simplicity. The cross-sectional views of FIGS. 1B-1I are shown for illustration purposes and may not be drawn to scale. FIGS. 1J-1K illustrate concentration profiles along lines C-C and D-D of FIGS. 1B-1I. The discussion of elements in FIGS. 1A-1L with the same annotations applies to each other, unless mentioned otherwise. In some embodiments, FET 100 can represent n-type FET 100 (NFET 100) or p-type FET 100 (PFET 100) and the discussion of FET 100 applies to both NFET 100 and PFET 100, unless mentioned otherwise.

Referring to FIG. 1A, FET 100 can include an array of gate structures 112 disposed on a fin structure 106 and an array of S/D regions 110 (one of S/D regions 110 visible in FIG. 1A) disposed on portions of fin structure 106 that are not covered by gate structures 112. FET 100 can further include gate spacers 114, shallow trench isolation (STI) regions 116, etch stop layer (ESL) 117, and interlayer dielectric (ILD) layers 118A-118B (ILD layer 118B not shown in FIG. 1A for simplicity; shown in FIGS. 1B-1E). ILD layer 118A can be disposed on ESL 117. ESL 117 can be configured to protect gate structures 112 and/or S/D regions 110. In some embodiments, gate spacers 114, STI regions 116, ESL 117, and ILD layers 118A-118B can include an insulating material, such as silicon oxide, silicon nitride (SiN), silicon carbon nitride (SiCN), silicon oxycarbon nitride (SiOCN), and silicon germanium oxide. In some embodiments, gate spacers 114 can have a thickness of about 2 nm to about 9 nm for adequate electrical isolation of gate structures 112 from adjacent structures.

FET 100 can be formed on a substrate 104. There may be other FETs and/or structures (e.g., isolation structures) formed on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structure 106 can include a material similar to substrate 104 and extend along an X-axis.

Figure 1C:
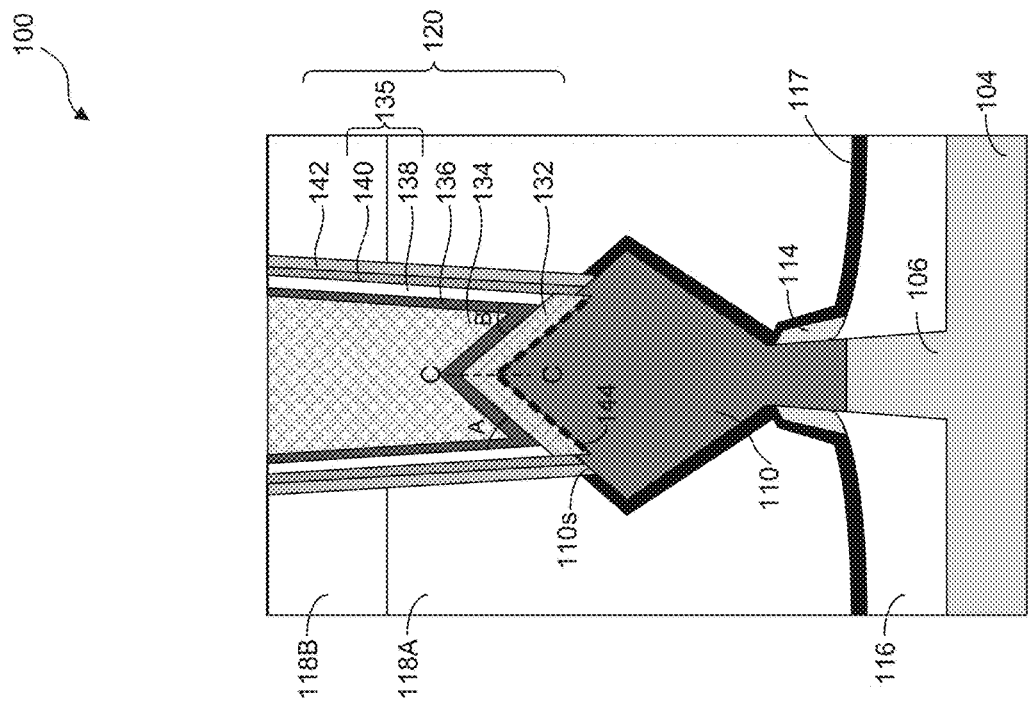
Figure 1B:
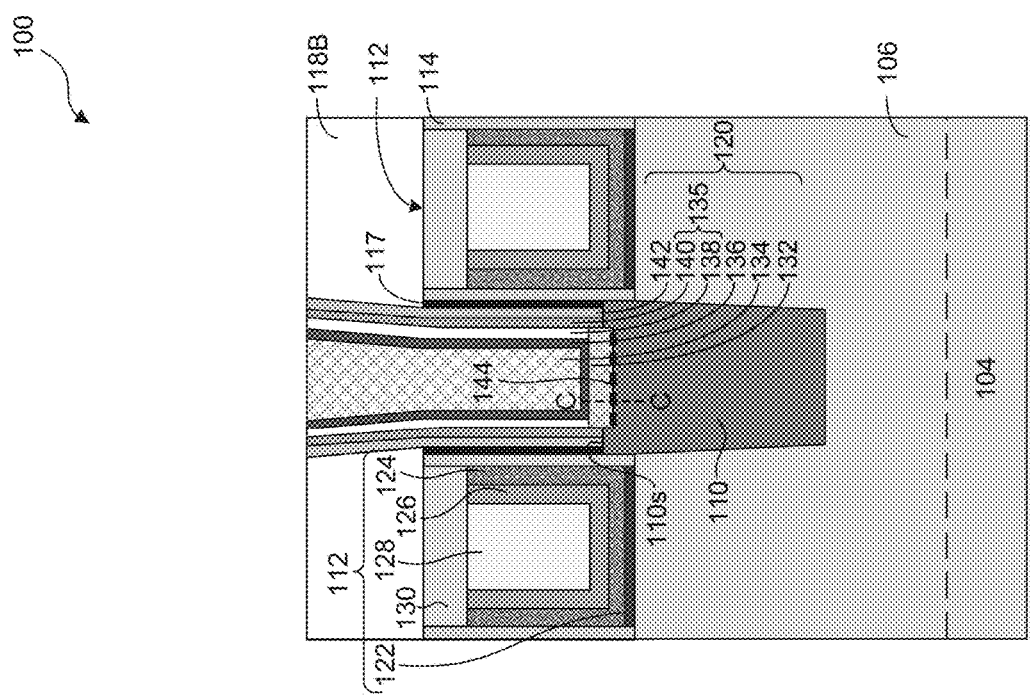

Referring to FIGS. 1B-1C, FET 100 can include gate structures 112, S/D region 110, and a S/D contact structure 120 disposed on S/D region 110. Gate structures 112 can be multi-layered structures. Each of gate structures 112 can include an interfacial oxide (IO) layer 122, a high-k (HK) gate dielectric layer 124 disposed on IO layer 122, a work function metal (WFM) layer 126 disposed on HK gate dielectric layer 124, a gate metal fill layer 128 disposed on WFM layer 126, and a gate capping layer 130 disposed on HK gate dielectric layer 124, WFM layer 126, and gate metal fill layer 128.

IO layers 122 can include silicon oxide ($SiO_2$), silicon germanium oxide ($SiGeO_x$), or germanium oxide ($GeO_x$). HK gate dielectric layers 124 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). For NFET 100, WFM layers 126 of gate structures 112 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based materials, or a combination thereof. For PFET 100, WFM layers 126 of gate structures 112 can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), and a combination thereof. Gate metal fill layers 128 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof. In some embodiments, gate structures 112 can be electrically isolated from overlying interconnect structures (not shown) by gate capping layers 130, which can include nitride layers.

For NFET 100, each of S/D regions 110 can include epitaxially-grown semiconductor material, such as Si, and n-type dopants, such as phosphorus and other suitable n-type dopants. For PFET 100, each of S/D regions 110 can include epitaxially-grown semiconductor material, such as Si or SiGe, and p-type dopants, such as boron and other suitable p-type dopants.

S/D contact structure 120 is disposed on S/D region 110. In some embodiments, S/D contact structure 120 can include (i) a WFM silicide layer 132 disposed on S/D region 110, (ii) a nitride capping layer 136 disposed on WFM silicide layer 132, (iii) a contact plug 134 disposed on nitride capping layer 136, (iv) a stack of metal-based liners 135 disposed on sidewalls of nitride capping layer 136, and (v) a barrier layer 142 disposed on stack of metal-based liners 135. FET 100 further includes a dipole layer 144 at an interface between WFM silicide layer 132 and S/D region 110 (also referred to herein as "interface 132-110"). In some embodiments, interface 132-110 can be disposed within S/D region 110 and can be non-coplanar with surfaces 110s of S/D region 110.

In some embodiments, a top surface of WFM silicide layer 132 can be above surface 110s (shown in FIGS. 1B-1C) or can be substantially coplanar with surface 110s (not shown). In some embodiments, WFM silicide layer 132 can form. angles A and B with the stack of metal-based liners 135, as shown in FIG. IC. Angles A and B can be similar or different from each other and can range from about 45 degrees to about 60 degrees. In some embodiments, for NFET 100, WFM silicide layer 132 can include a metal or a metal silicide with a work function value closer to a conduction band-edge energy than a valence band-edge energy of the material of S/D region 110. For example, the metal or the metal silicide can have a work function value less than 4.5 eV (e.g., about 3.5 eV to about 4.4 eV). which can be closer to the conduction band energy (e.g., 4.1 eV for Si) than the valence band energy (e.g., 5.2 eV for Si) of Si-based material of S/D region 110. In some embodiments, for NFET 100, the metal silicide of WFM silicide layer 132 can include titanium silicide (TixSiy), tantalum silicide (TaxSix,), molybdenum silicide (MoxSiy), zirconium silicide (ZrxSiy), hafnium silicide (HfxSiy), scandium silicide (ScxSiy), yttrium silicide (YxSiy), terbium silicide (TbxSiy), lutetium silicide (Lu,$ iy), erbium silicide (ErxSiy), ybtterbium silicide (YhxSiy), europium silicide (EuxSiy), thorium silicide (ThxSiy), or a combination thereof.

In some embodiments, for PFET 100, WFM silicide layer 132 can include a metal or a metal silicide with a work function value closer to a valence band-edge energy than a conduction band-edge energy of the material of S/D region 110. For example, the metal or the metal silicide can have a work function value greater than 4.5 eV (e.g., about 4.5 eV to about 5.5 eV), which can be closer to the valence band energy (e.g., 5.2 eV for Si) than the conduction band energy (e.g., 4.1 eV for Si) of Si-based material of S/D region 110. In some embodiments, for PFET 100, the metal silicide of WFM silicide layer 132 can include nickel silicide ($Ni_xSi_y$), cobalt silicide ($Co_xSi_y$), manganese silicide ($Mn_xSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), or a combination thereof.

In some embodiments, WFM silicide layer 132 can further include dopants of a transition metal, which has an electronegativity value smaller than the electronegativity value of the metal of the metal silicide included in WFM silicide layer 132. For example, the dopants can include a transition metal, such as zirconium (Zr), hafnium (Hf), ybtterbium (Yb), yttrium (Y), erbium (Er), cerium (Ce), scandium (Sc), and a combination thereof. In some embodiments, some dopants can diffuse into S/D region 110. The dopants can induce the formation of charged dipoles in dipole layer 144 at interface 132-110. Dipole layer 144 can include charged dipoles of silicon ions from S/D region 110 and transition metal ions from the dopants in WFM silicide layer 132. For example, dipole layer 144 can include Zr—Si, Hf—Si, Yb—Si, Y—Si, Er—Si, Ce—Si, or Sc—Si dipoles when WFM silicide layer 132 includes Zr, Hf, Yb, Y, Er, Ce, or Sc dopants.

The electric fields generated at interface 132-110 by dipoles in dipole layer 144 can reduce the SBH between WFM silicide layer 132 and S/D region 110, and consequently reduce the contact resistance between S/D contact structure 120 and S/D region 110. Based on the type and concentration of dipoles in dipole layer 144 at interface 132-110, the SBH between WFM silicide layer 132 and S/D region 110 can be reduced by about 35% to about 70% compared to the SBH between WFM silicide layer 132 and S/D region 110 without dipole layer 144. In some embodiments, the SBH can range from about 0.2 eV to about 0.4 eV. The concentration of dipoles at interface 132-110 is directly proportional to the concentration of dopants in WFM silicide layer 132 and/or interface 132-110. The concentration of dopants in WFM silicide layer 132 and/or interface 132-110 can range from about 1 atomic percent to about 10 atomic percent. A dopant concentration below this range may not induce the formation of dipoles in dipole layer 144. On the other hand, if the dopant concentration is above this range, the duration and complexity of the doping process increases, and consequently increases device manufacturing cost.

The dopant concentration can have profiles 146, 148, and/or 150 across WFM silicide layer 132 and S/D region 110 along lines C-C of FIGS. 1B-1C, as shown in FIG. 1J, according to some embodiments. The dopant concentration can have profile 146 with a peak dopant concentration C1 at interface 132-110 when WFM silicide layer 132 is doped with a transition metal (e.g., Zr, Hf, etc.) in a doping process that does not include a high temperature (e.g., temperature greater than 500° C.) annealing process, as described in detail below. The dopant concentration can have profile 148 when WFM silicide layer 132 is doped with a non-Zr-based transition metal (e.g., Hf, Ce, Er, etc.) in a doping process that does not include a high temperature annealing process. The non-Zr-based transition dopants can have a lower thermodynamic stability at interface 132-110 than Zr dopants, which can cause a larger number of the non-Zr-based transition dopants to diffuse away from interface 132-110 and into WFM silicide layer 132. As a result, as shown in FIG. 1J, the peak dopant concentration of profile 148 can be a distance D1 (e.g., about 0.1 nm to about 0.5 nm) away from interface 132-110 and can have a dopant concentration C2 at interface 132-110, which is smaller than peak dopant concentration C1.

In some embodiments, when the doping of WFM silicide layer 132 includes a high temperature annealing process, the non-Zr-based dopants can diffuse further into WFM silicide layer 132 due to dopants' lower thermodynamic stability at interface 132-110 and can have a dopant concentration profile 150, as shown in FIG. 1J. The peak dopant concentration of profile 150 can be a distance D2 (e.g., about 0.2 nm to about 0.8 nm) away from interface 132-110, which is greater than distance D1, and can have a dopant concentration C3 at interface 132-110, which is smaller than dopant concentration C2. As the concentration of dopants at interface 132-110 is directly proportional to the concentration of dipoles at interface 132-110, dipole concentration in dipole layer 144 can be greater for profile 146 than for profiles 148 and 150, and dipole concentration in dipole layer 144 for profile 148 can be greater than for profile 150. As a result, the SBH between WFM silicide layer 132 and S/D region 110 can be lower for profile 146 than for profiles 148 and 150, and the SBH between WFM silicide layer 132 and S/D region 110 can be lower for profile 148 than for profile 150. In some embodiments, the dopant concentration across along lines C-C of FIGS. 1B-1C can have profiles 146 and 148 or can have profiles 146 and 150 when WFM silicide layer 132 is doped with a combination of Zr metal and one or more non-Zr-based transition metals.

Figure 17B:
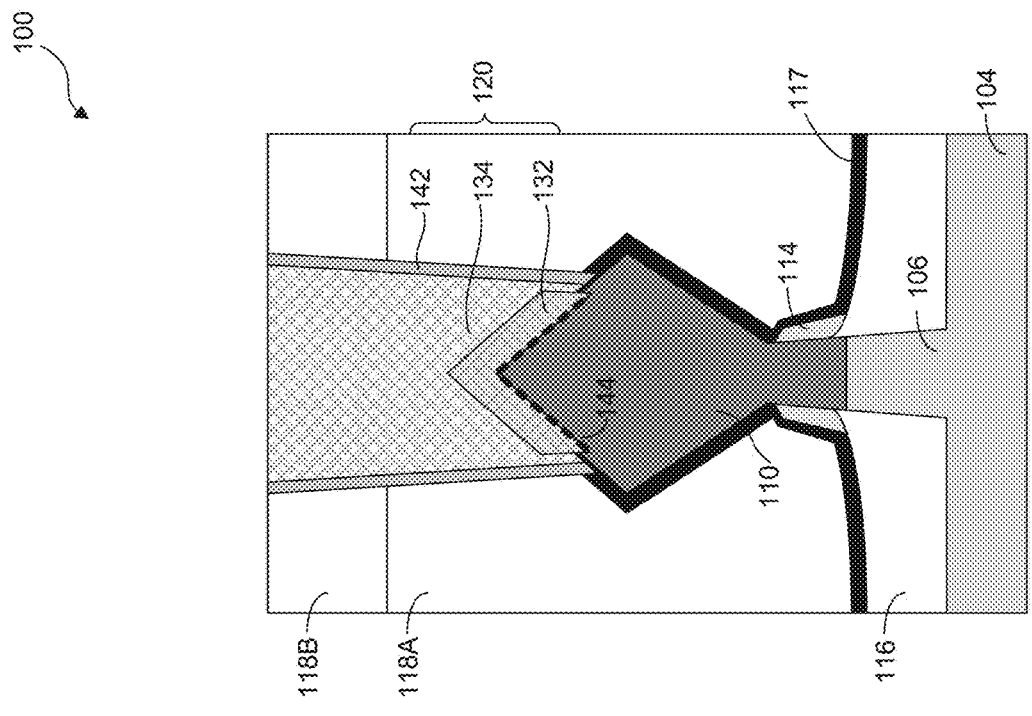
Figure 17A:
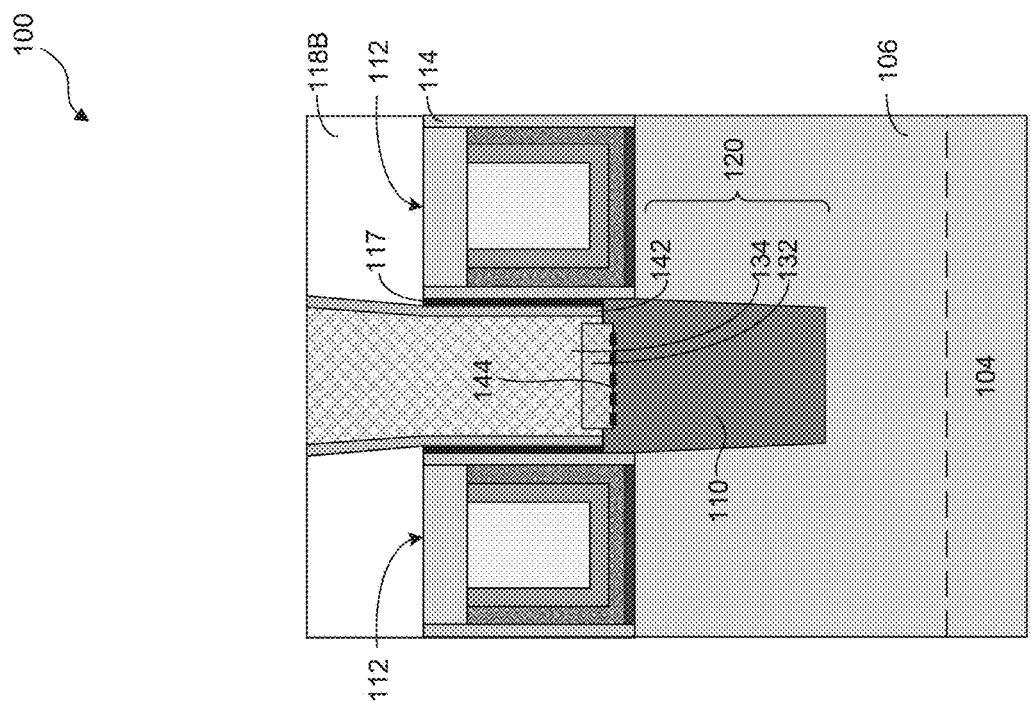

Referring to FIGS. 1B-1C, contact plug 134 can include conductive materials, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), stannum (Sn), silver (Ag), gold (Au), zinc (Zn), cadmium (Cd), and a combination thereof. Nitride capping layer 136 can be formed to protect the underlying layers (e.g., WFM silicide layer 132) during subsequent processing of S/D contact structure 120. Stack of metal-based liners 135 can include a first liner 138 and a second liner 140. First liner 138 can be a portion of a source layer that is used in the formation of WFM silicide layer 132, as described in detail below, and can include a metal of WFM silicide layer 132 or can include an oxide of a metal of WFM silicide layer 132. Second liner 140 can be a portion of a source that is used in the doping of WFM silicide layer 132, as described in detail below, and can include a transition metal of the dopants in WFM silicide layer 132 or can include an oxide of the metal of the dopants. In some embodiments, first and/or second liners 138-140 may not be present in stack of metal-based liners 135 or stack of metal-based liners 135 may not be present in S/D contact structure 120 (shown in FIGS. 17B-17C). Barrier layer 142 can include a nitride material and can reduce or prevent the diffusion of oxygen atoms from ILD layers 118A-118B into contact plug 134 to prevent the oxidation of the conductive material of contact plug 134.

Figures 1D, 1E:
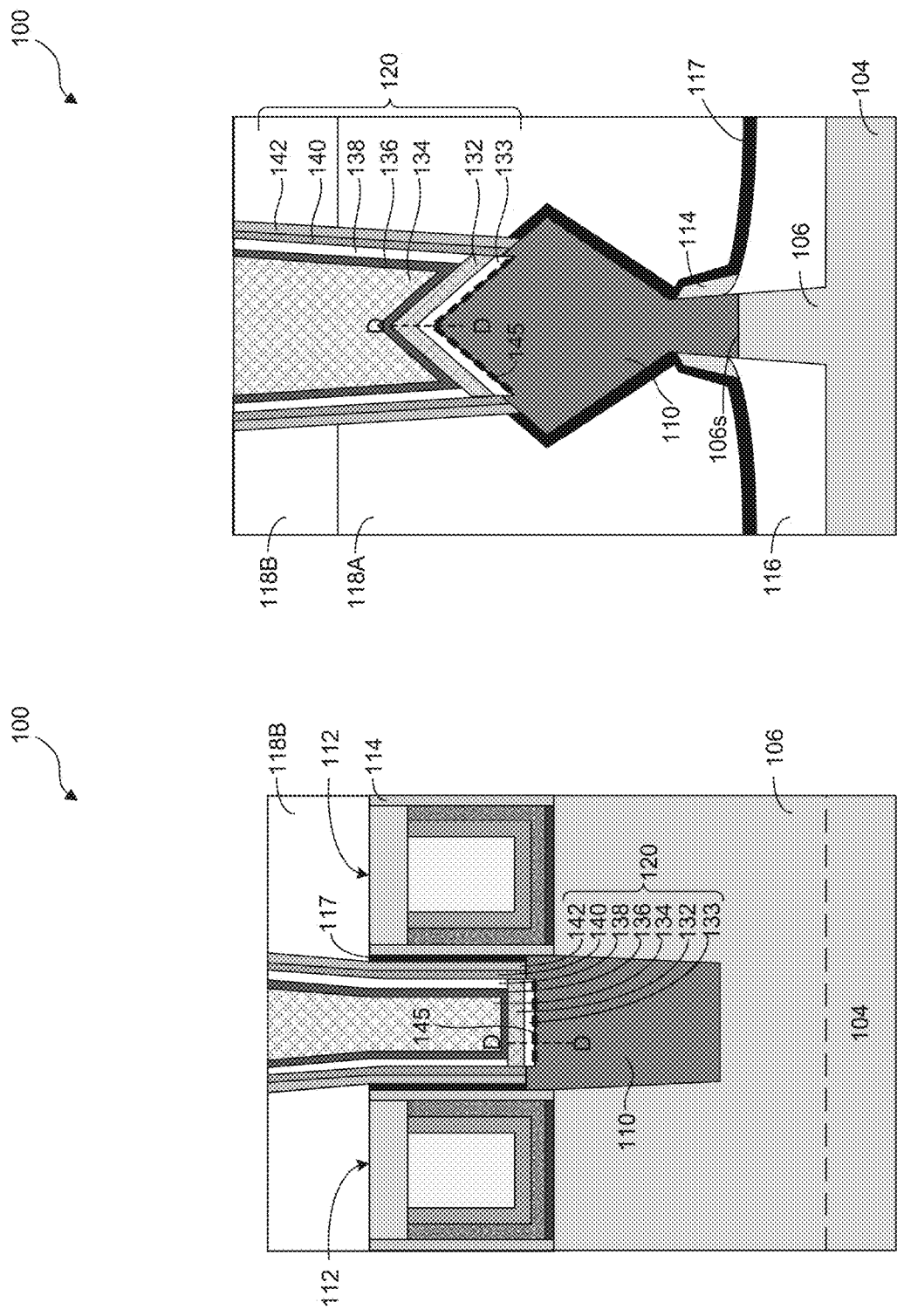

In some embodiments, S/D contact structure 120 can have cross-sectional views as shown in FIGS. 1D-1I when WFM silicide layer 132 is doped with Zr metal in a doping process that includes a high temperature annealing process. FIGS. 1D-1E illustrate cross-sectional views along line B-B of FIG. 1A with additional structures that are not shown in FIG. 1A for simplicity. S/D contact structure 120 can include a Zr-based ternary compound (ZTC) layer 133 interposed between WFM silicide layer 132 and S/D region 110. The Zr dopants of WFM silicide layer 132 can interact with Si atoms of S/D region 110 and metal atoms of WFM silicide layer 132 during the high temperature annealing process to form ZTC layer 133. ZTC layer 133 can include zirconium metal silicide ($Zr_xM_ySi_z$), where metal (M) is the metal of WFM silicide layer 132. In some embodiments, ZTC layer 133 can include zirconium titanium silicide ($Zr_3Ti_2Si_3$) when WFM silicide layer 132 includes $Ti_xSi_y$. ZTC layer 133 can induce the formation of dipole layer 145 at an interface between ZTC layer 133 and S/D region 110 (also referred to herein as "interface 133-110"). Dipole layer 145 can include Zr—Si dipoles of Zr metal ions from ZTC layer 133 and silicon ions from S/D region 110.

Similar to dipole layer 144, the electric fields generated at interface 133-110 by dipole layer 145 can reduce the SBH by about 35% to about 70% between WFM silicide layer 132 and S/D region 110, and consequently reduce the contact resistance between S/D contact structure 120 and S/D region 110. The concentration of Zr atoms in ZTC layer 133 can range from about 1 atomic percent to about 10 atomic percent. In some embodiments, the Zr atoms can have a concentration profile 158 across WFM silicide layer 132, ZTC layer 133, and S/D region 110 along lines D-D of FIGS. 1D-1E, as shown in FIG. 1K.

Figure 1G:
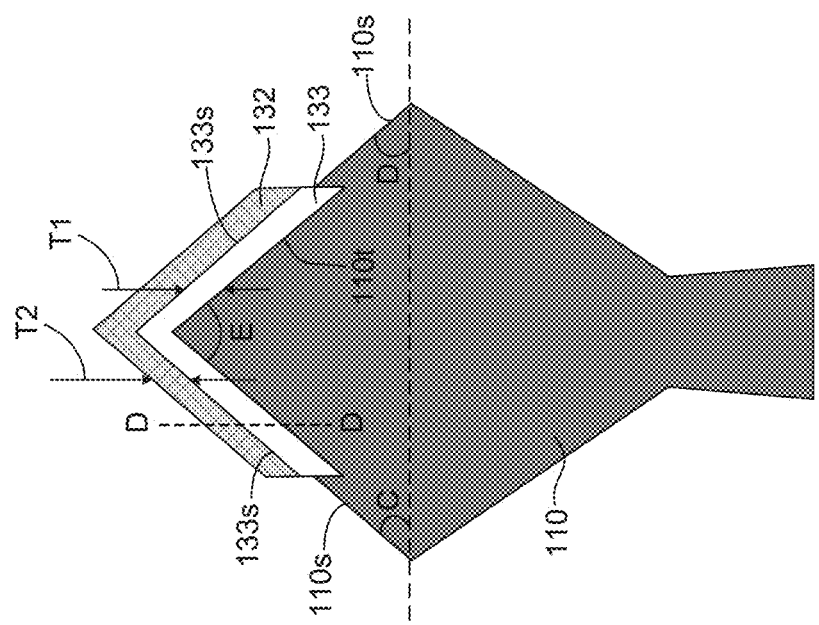
Figure 1F:
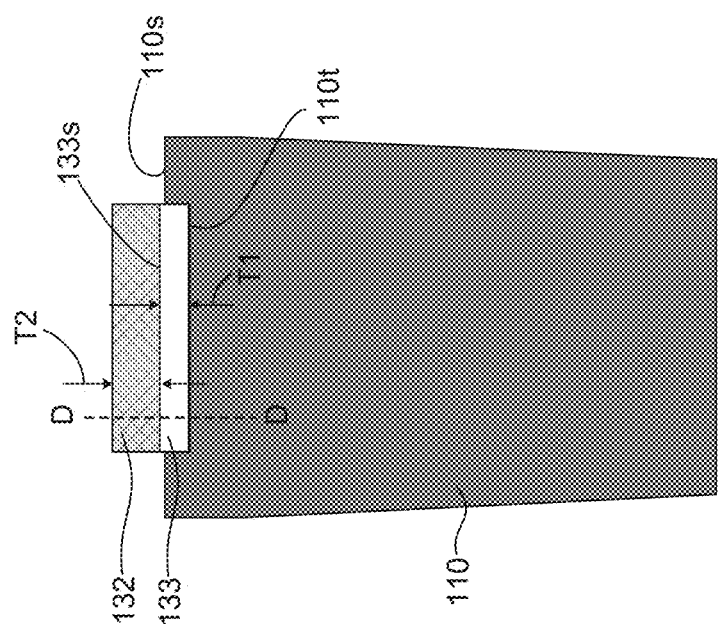

FIGS. 1F-1G illustrate enlarged views of S/D region 110, WFM silicide layer 132, and ZTC layer 133 of FIGS. 1D-1E. In some embodiments, ZTC layer 133 can have top surfaces 133s with a (1121) crystal orientation (also referred to as (1121) crystal plane) when formed on S/D region 110 with surfaces 110s-110t having a (111) crystal orientation (also referred to as (111) crystal plane). Surface 110s can be the top surface of S/D region 110 and surface 110t can be the surface that forms an interface with ZTC layer 133. Surfaces 110s-110t can have a (111) crystal orientation when semiconductor material of S/D region 110 is epitaxially grown on top surface 106s of fin structure 106 in a bottom-up approach, as shown in FIGS. 1A-1E, and not epitaxially grown as a cladding around fin structure 106, as described below with reference to FIGS. 3A-3C. To have the (111) crystal orientation, surfaces 110s can be formed at angles C and D relative to a horizontal axis (e.g., an X-axis), where angles C and D range from about 50 degrees to about 60 degrees. Angles C and D can be equal to or different from each other. In some embodiments, surfaces of ZTC layer 133 facing WFM silicide layer 132 and S/D region 110 can be unfaceted surfaces, which are in contrast to ZTC layer 333 described below with reference to FIGS. 3C-3G and 4C. Due to the different crystal orientations between surfaces 110s-110t and 133s, a lattice mismatch ranging from about 0.5% to about 1% can be present between S/D region 110 and ZTC layer 133. In some embodiments, the lattice mismatch can be about 0.7% when S/D region 110 includes Si material and ZTC layer 133 includes $Zr_3Ti_2Si_3$. The lattice mismatch can be different for different crystal orientations of S/D region 110 and ZTC layer 133, as described below with reference to FIGS. 3A-3C. In some embodiments, interface 133-110 can be disposed within S/D region 110 and non-coplanar with surfaces 110s of S/D region 110, as shown in FIGS. 1D-1G.

In some embodiments, for adequate reduction of SBH (e.g., SBH ranging from about 0.2 eV to about 0.4 eV) between S/D region 110 and WFM silicide layer 132, ZTC layer 133 can have a thickness T1 along a Z-axis ranging from about 0.25 nm to about 1 nm and WFM silicide layer 132 can have a thickness T2 along a Z-axis ranging from about 2 nm to about 6 nm, which is greater than thickness T1. The ratio of T1:T2 can range from about 1:2 to about 1:20 to achieve an SBH ranging from about 0.2 eV to 0.4 eV between S/D region 110 and WFM silicide layer 132. Thickness T1 can depend on the concentration of Zr dopants in WFM silicide layer 132 prior to the formation of ZTC layer 133. The relationship between thickness T1 and the Zr dopant concentration in WFM silicide layer can be represented by the graph of FIG. 1L. In some embodiments, thickness T1 can be directly proportional to Zr dopant concentration ranging from about 1 atomic percent to about 10 atomic percent in WFM silicide layer 132 and can be independent of Zr dopant concentration above 10 atomic percent in WFM silicide layer 132. In some embodiments, top surfaces 133s of ZTC layer 133 converge at an angle E, which can be equal to or smaller than angles C and/or D.

Figure 1I:
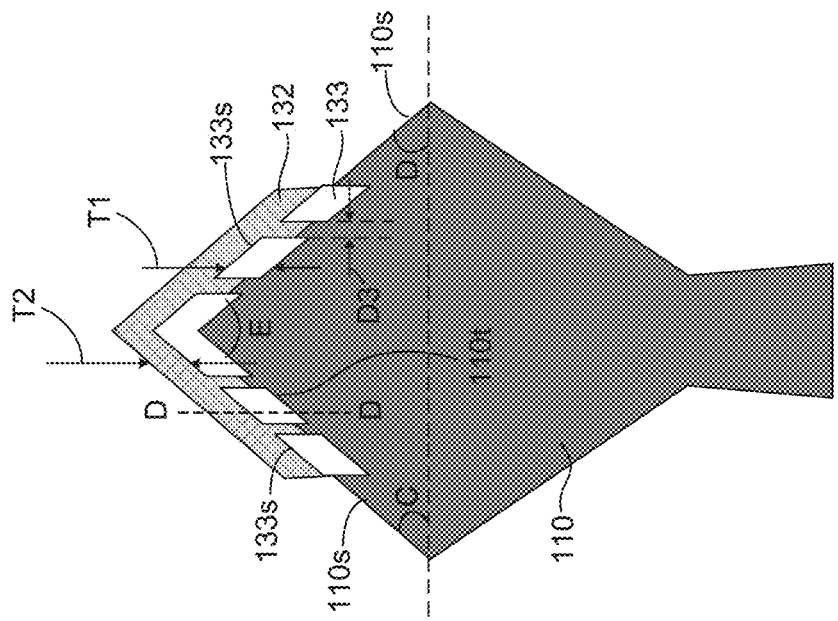
Figure 1H:
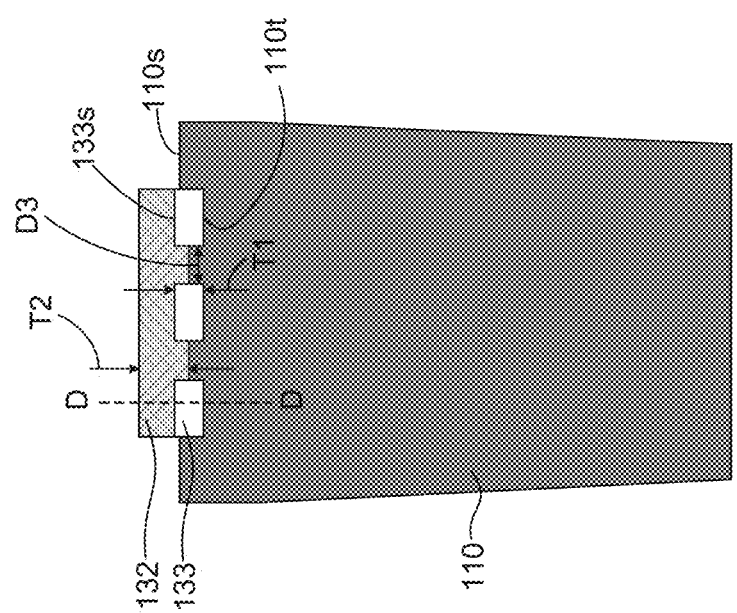
Figure 1J:
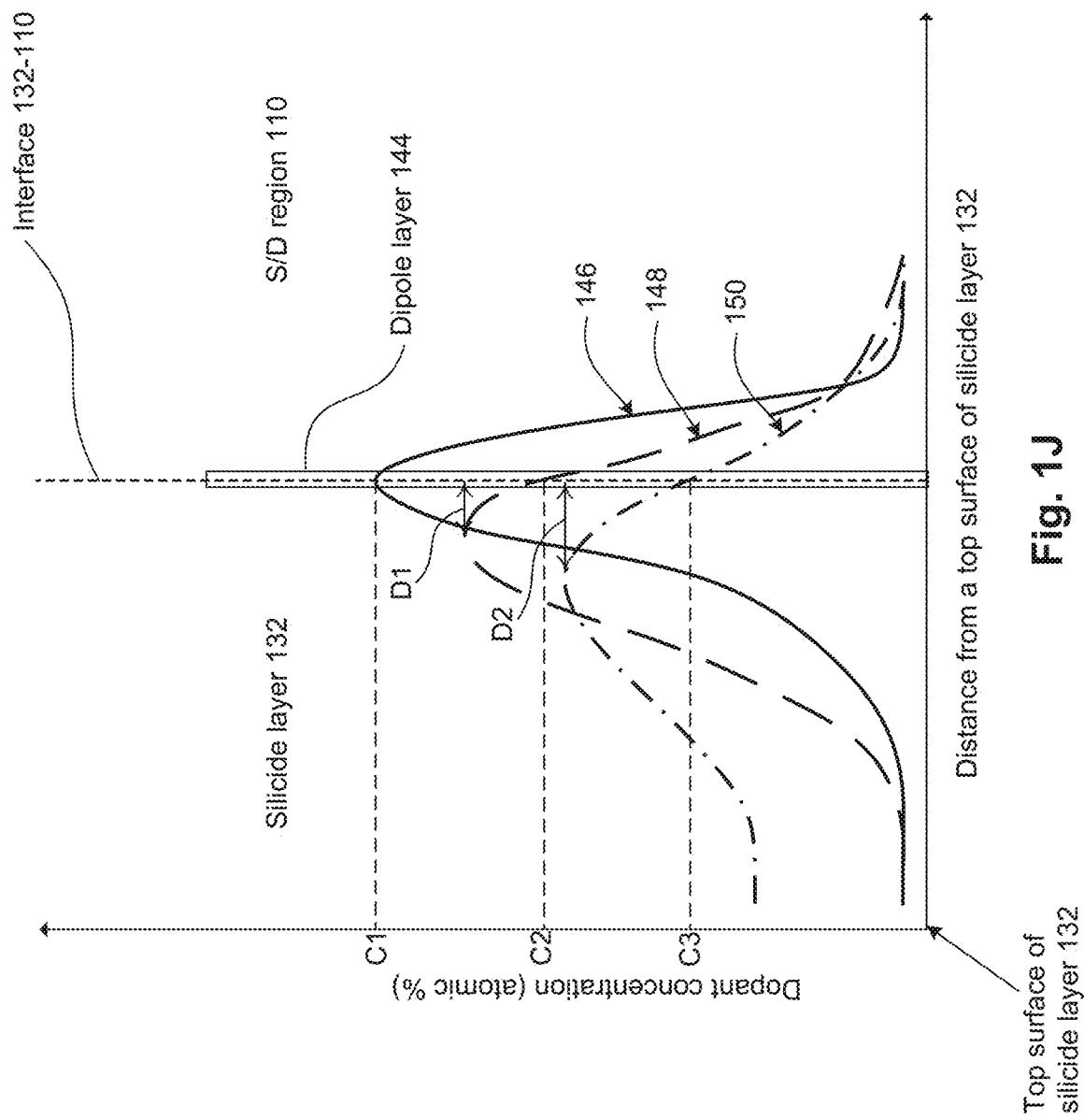
Figure 1K:
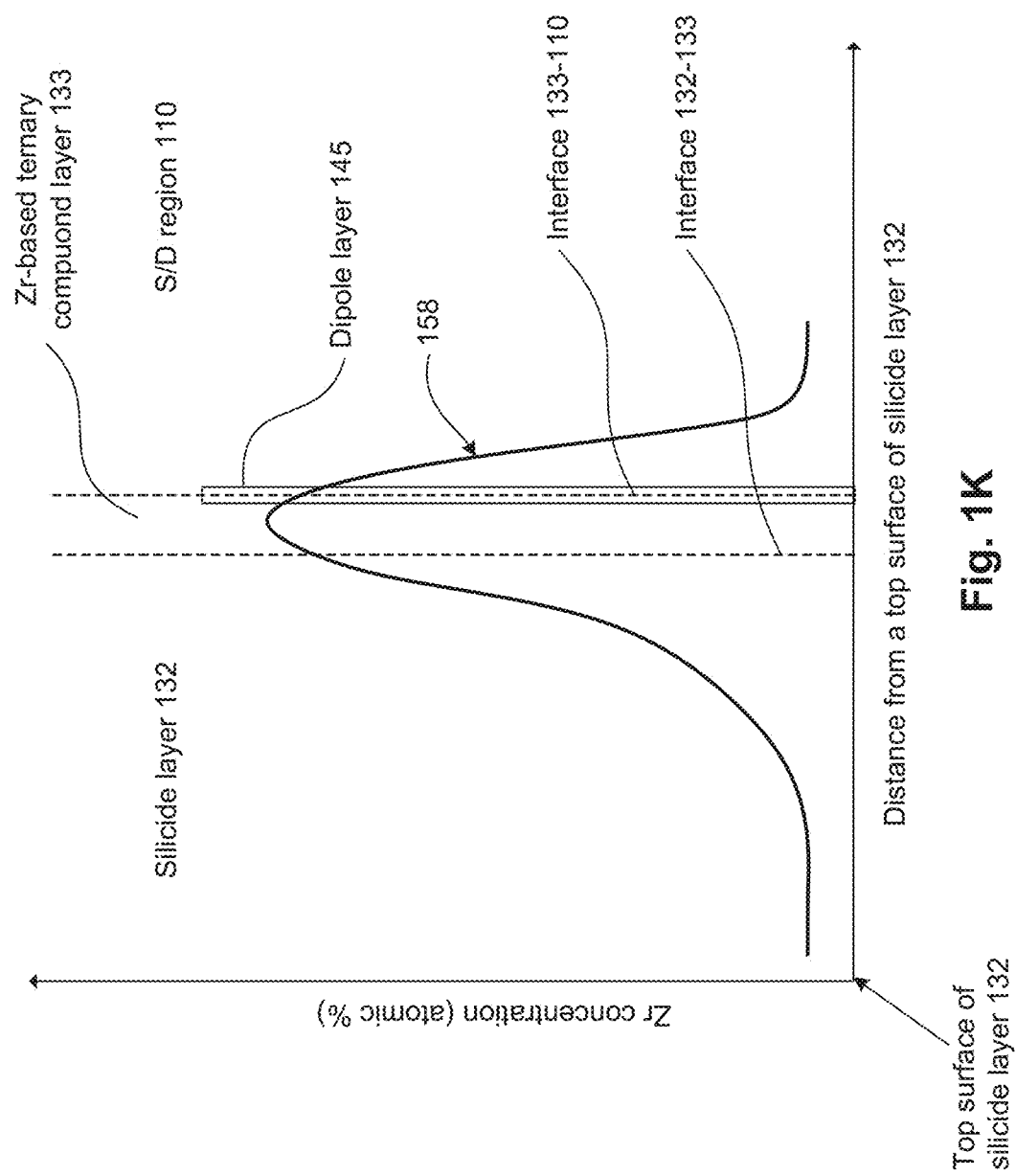

In some embodiments, instead of ZTC layer 133 being a continuous layer, as shown in FIGS. 1D-1G, ZTC layer 133 can a discontinuous layer, as shown in FIGS. 1H-1I. The discussion of continuous ZTC layer 133 applies to discontinuous ZTC layer 133, unless mentioned otherwise. The discontinuity in ZTC layer 133 can be induced by the lattice mismatch between S/D region 110 and ZTC layer 133. In some embodiments, adjacent portions of discontinuous ZTC layer 133 can be separated from each other by a distance D3 ranging from about 0.05 nm to about 1 nm for effectively reducing an SBH between WFM silicide layer 132 and S/D region 110. In some embodiments, interfaces between WFM silicide layer 132 and S/D region 110 (also referred to herein as "interfaces 132-110"), which are disposed within adjacent portions of discontinuous ZTC layer 133, can be at a surface plane that is below (shown in FIGS. 1H-1I) top surfaces 133s or can be coplanar (not shown) with top surfaces 133s. In some embodiments, interfaces between WFM silicide layer 132 and ZTC layer 133 (also referred to herein as "interfaces 132-133") can be at a surface plane above (shown in FIGS. 1D-1I) or below (not shown) surfaces 110s or can be coplanar (not shown) with surfaces 110s.

Figure 2B:
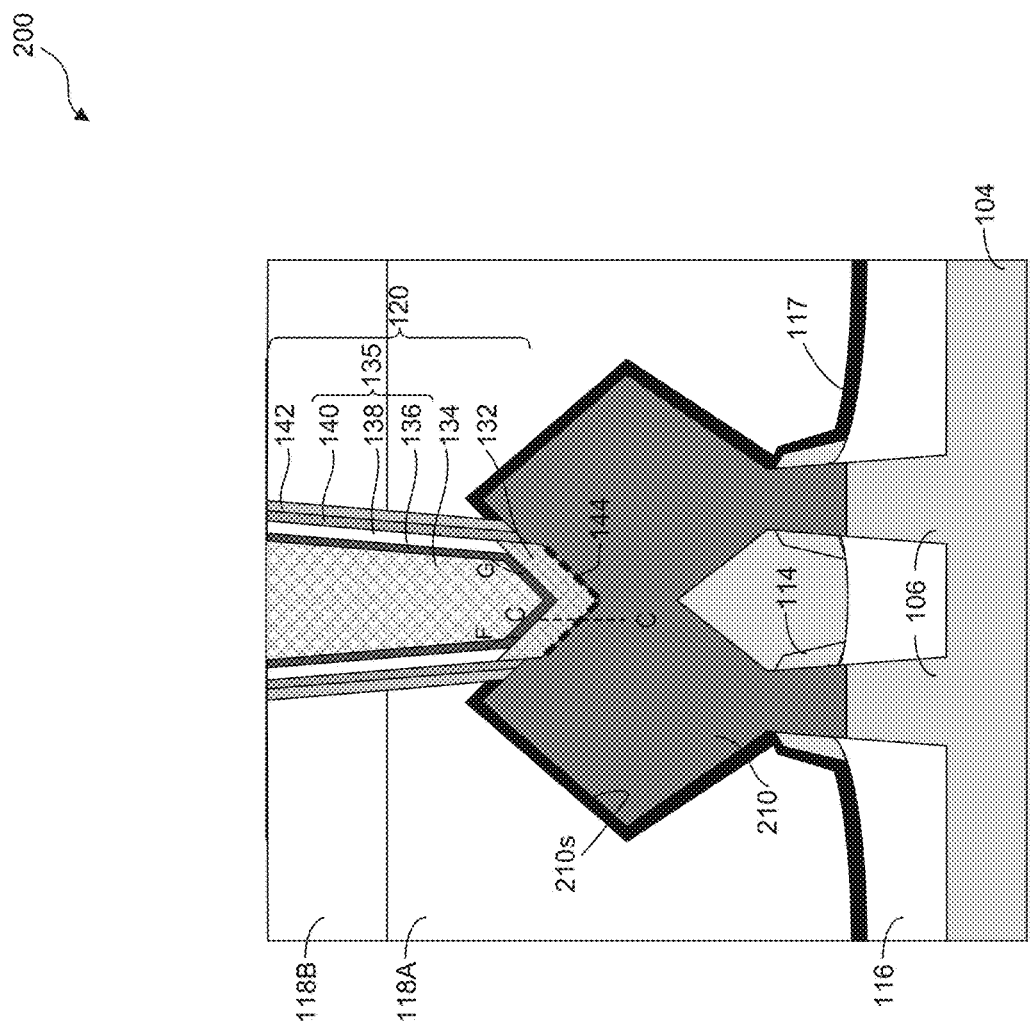

FIG. 2A illustrates an isometric view of a FET 200, according to some embodiments. The discussion of FET 100 applies to FET 200, unless mentioned otherwise. FET 200 can have different cross-sectional views, as illustrated in FIGS. 2B-2E, according to some embodiments. FIGS. 2B-2E illustrate cross-sectional views of FET 200 along line E-E of FIG. 2A with additional structures that are not shown in FIG. 2A for simplicity. The cross-sectional views of FIGS. 2B-2E are shown for illustration purposes and may not be drawn to scale. The discussion of elements in FIGS. 1A-1L and 2A-2E with the same annotations applies to each other, unless mentioned otherwise.

Referring to FIG. 2A, FET 200 can have merged S/D regions 210 disposed on fin structures 106. The discussion of S/D region 110 applies to merged S/D region 210, unless mentioned otherwise. Referring to FIG. 2B, FET 200 can include S/D structure 120 disposed on merged S/D region 210. In some embodiments, a top surface of WFM silicide layer 132 can be above surfaces 210s (shown in FIG. 2B) or can be substantially coplanar with surfaces 210s (not shown). In some embodiments, WFM silicide layer 132 can form angles F and G with the stack of metal-based liners 135, as shown in FIG. 2B. Angles F and G can be similar or different from each other and can range from about 135 degrees to about 155 degrees. Dopants of WFM silicide layer 132 can induce the formation of dipole layer 144 at an interface between WFM silicide layer 132 and merged S/D region 210 (also referred to herein as "interface 132-210"). In some embodiments, interface 132-210 can be disposed within S/D region 210 and can be non-coplanar with surfaces 210s of merged S/D region 210. The discussion of dopant concentration profiles along line C-C of FIG. 1C applies to line C-C of FIG. 2B.

Figure 2C:
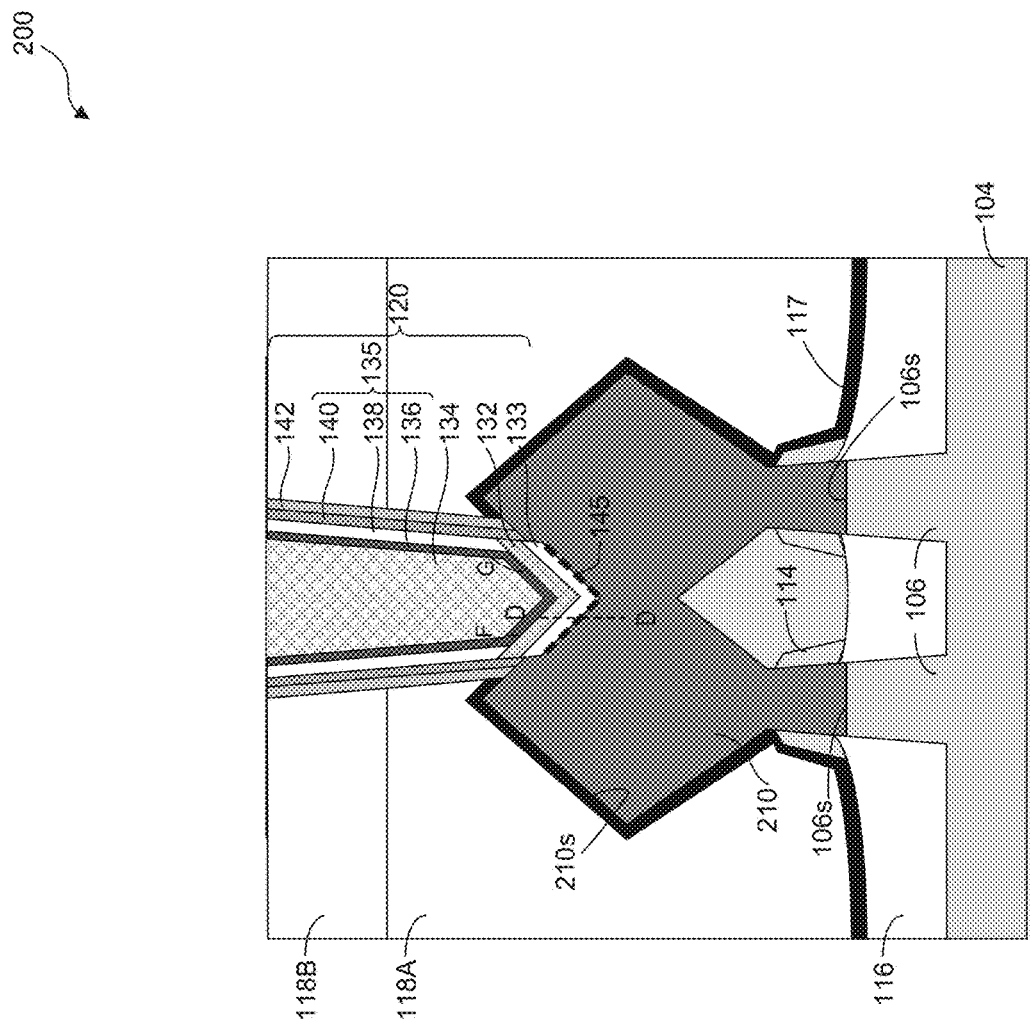
Figure 2E:
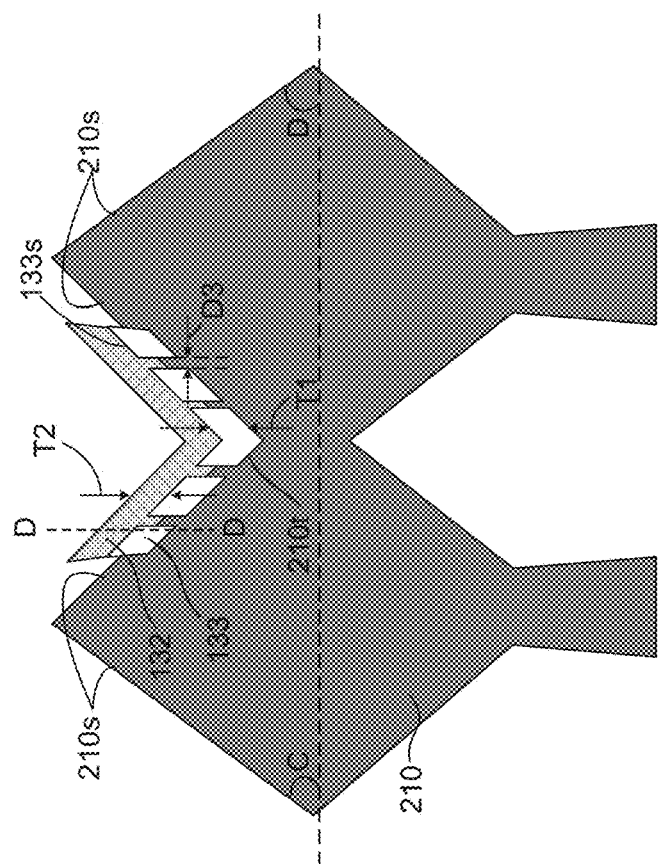
Figure 2D:
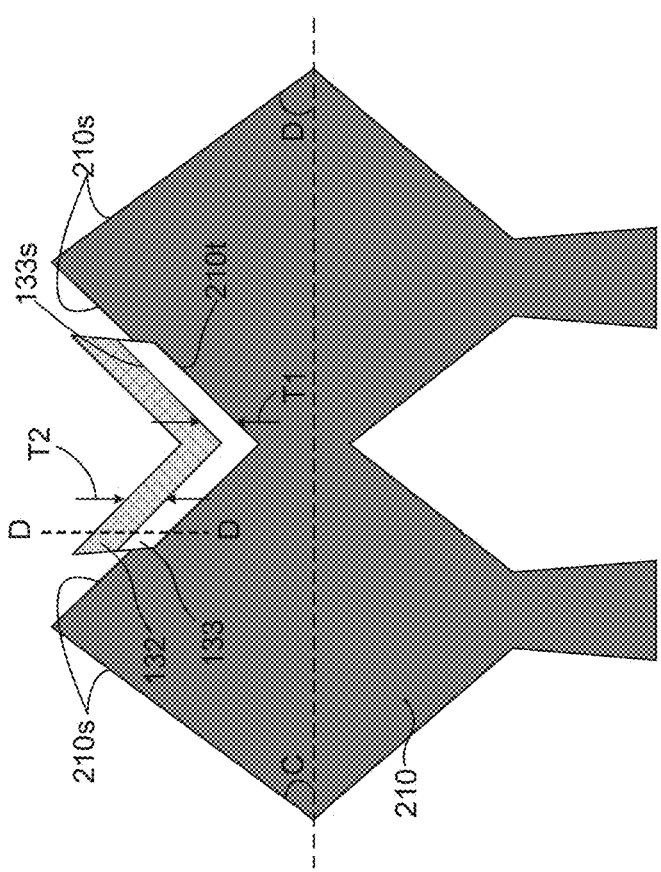

In some embodiments, S/D contact structure 120 can have a cross-sectional view as shown in FIG. 2C when S/D structure 120 includes ZTC layer 133 disposed on merged S/D region 210. The discussion of dopant concentration profile along line D-D of FIG. 1E applies to line D-D of FIG. 2C. FIG. 2D illustrates an enlarged view of merged S/D region 210, WFM silicide layer 132, and ZTC layer 133 of FIG. 2B. Similar to S/D region 110, surfaces 210s-210t of merged S/D region 210 can have a (111) crystal orientation because semiconductor material of merged S/D region 210 is epitaxially grown on top surface 106s (shown in FIG. 2C) of fin structures 106 in a bottom-up approach. As a result, ZTC layer 133 can have top surfaces 133s with a (1121) crystal orientation when formed on merged S/D region 210 with surfaces 210s-210t having a (111) crystal orientation. Surface 210s can be the top surface of S/D region 210 and surface 210t can be the surface that forms interface with ZTC layer 133.

To have the (111) crystal orientation, surfaces 210s can be formed at angles C and D relative to a horizontal axis (e.g., an X-axis), where angles C and D ranges from about 50 degrees to about 60 degrees. Angles C and D can be equal to or different from each other. A lattice mismatch ranging from about 0.5% to about 1% can be present between merged S/D region 210 and ZTC layer 133. In some embodiments, the lattice mismatch can be about 0.7% when merged S/D region 210 includes Si material and ZTC layer 133 includes $Zr_3Ti_2Si_3$. In some embodiments, interfaces between ZTC layer 133 and merged S/D region 210 (also referred to herein as "interfaces 133-210") can be disposed within merged S/D region 210 and can be non-coplanar with surfaces 210s of merged S/D region 210, as shown in FIGS. 2C-2D. In some embodiments, instead of ZTC layer 133 being a continuous layer, as shown in FIGS. 2C-2D, ZTC layer 133 can a discontinuous layer, as shown in FIG. 2E. The discussion of continuous ZTC layer 133 of FIGS. 2C-2D applies to discontinuous ZTC layer 133 of FIG. 2E, unless mentioned otherwise.

Figure 3B:
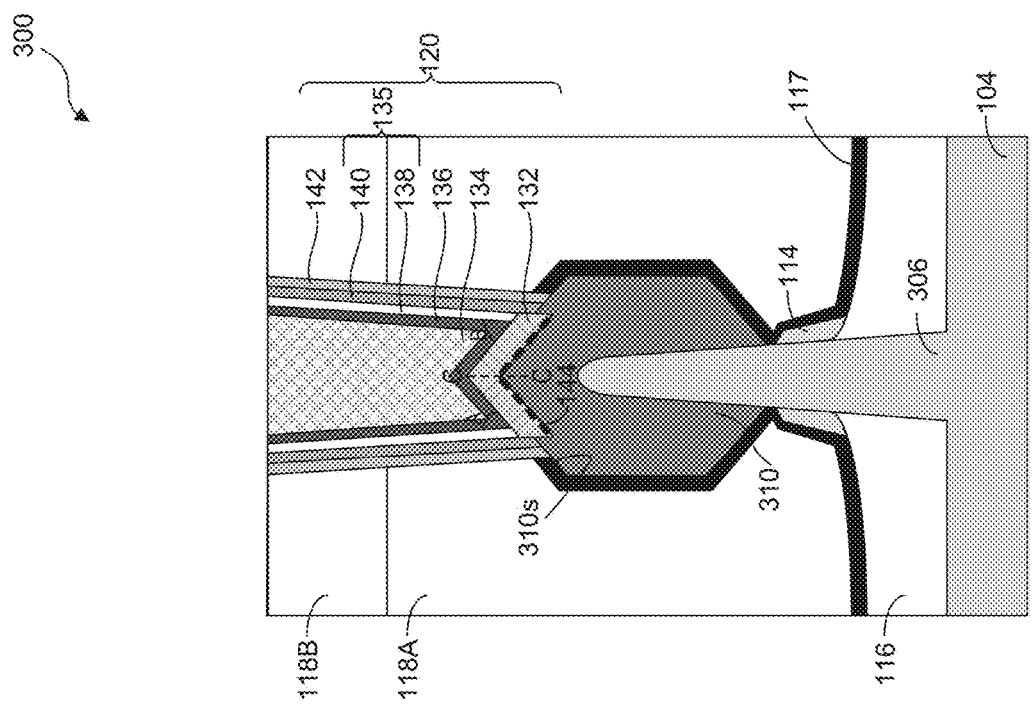

FIG. 3A illustrates an isometric view of a FET 300, according to some embodiments. The discussion of FET 100 applies to FET 300, unless mentioned otherwise. FET 300 can have different cross-sectional views, as illustrated in FIGS. 3B-3G, according to some embodiments. FIGS. 3B-3G illustrate cross-sectional views of FET 300 along line F-F of FIG. 3A with additional structures that are not shown in FIG. 3A for simplicity. The cross-sectional views of FIGS. 3B-3G are shown for illustration purposes and may not be drawn to scale. The discussion of elements in FIGS. 1A-1L and 3A-3G with the same annotations applies to each other, unless mentioned otherwise.

Referring to FIG. 3A, FET 300 can have S/D regions 310 epitaxially grown as cladding around portions of fin structure 306 extending above STI regions 116, instead of bottom-up epitaxially grown S/D regions 110. The discussion of S/D region 110 applies to S/D region 310, unless mentioned otherwise. Referring to FIG. 3B, FET 300 can include S/D structure 120 disposed on S/D region 310. In some embodiments, a top surface of WFM silicide layer 132 can be above surfaces 310s (shown in FIG. 3B) or can be substantially coplanar with surfaces 310s (not shown). Dopants of WFM silicide layer 132 can induce the formation of dipole layer 144 at an interface between WFM silicide layer 132 and S/D region 310 (also referred to herein as "interface 132-310"). In some embodiments, interface 132-310 can be disposed within S/D region 310 and can be non-coplanar with surfaces 310s. The discussion of dopant concentration profiles along line C-C of FIG. 1C applies to line C-C of FIG. 3B.

Figure 3C:
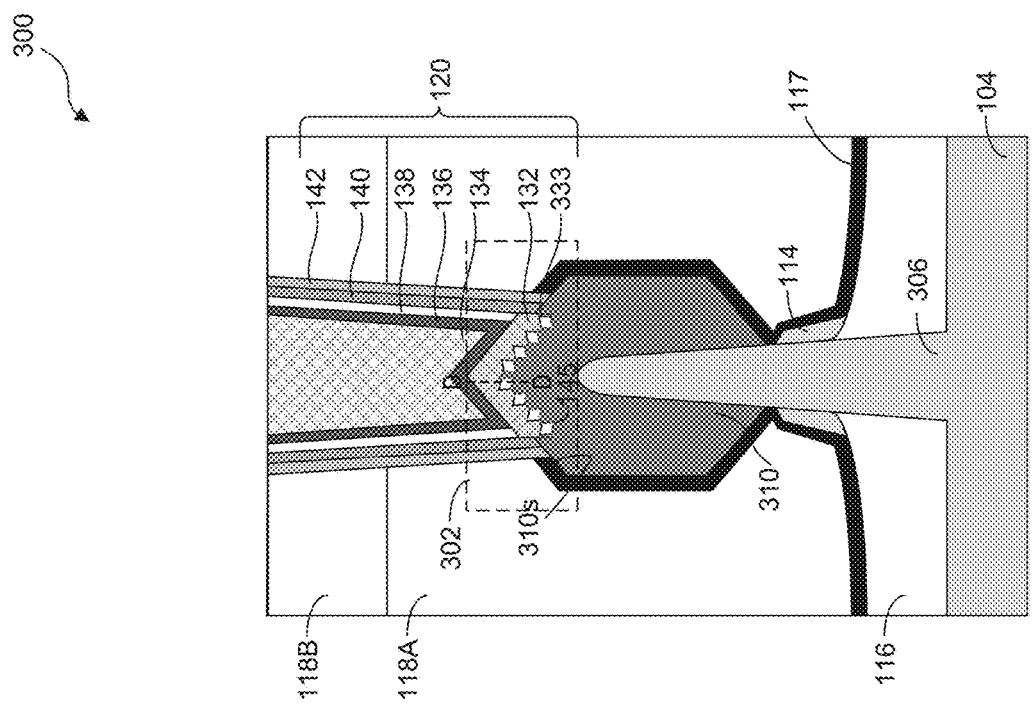

In some embodiments, S/D contact structure 120 can a have cross-sectional view as shown in FIG. 3C when S/D contact structure 120 includes ZTC layer 333 interposed between WFM silicide layer 132 and S/D region 310. The discussion of ZTC layer 133 applies to ZTC layer 333, unless mentioned otherwise. The Zr dopants of WFM silicide layer 132 can interact with Si atoms of S/D region 310 and metal atoms of WFM silicide layer 132 during the high temperature annealing process to form ZTC layer 333. ZTC layer 333 can include zirconium metal silicide ($Zr_xM_ySi_z$), where metal (M) is the metal of WFM silicide layer 132. In some embodiments, ZTC layer 333 can include zirconium titanium silicide ($Zr_3Ti_2Si_3$) when WFM silicide layer 132 includes $Ti_xSi_y$. ZTC layer 333 can induce the formation of dipole layer 145 at interfaces between ZTC layer 333 and S/D region 310 (also referred to herein as "interfaces 333-310") and interfaces between WFM silicide layer 132 and S/D region 310. Dipole layer 145 can include Zr—Si dipoles of Zr metal ions from ZTC layer 333 and silicon ions from S/D region 310.

Figure 3D:
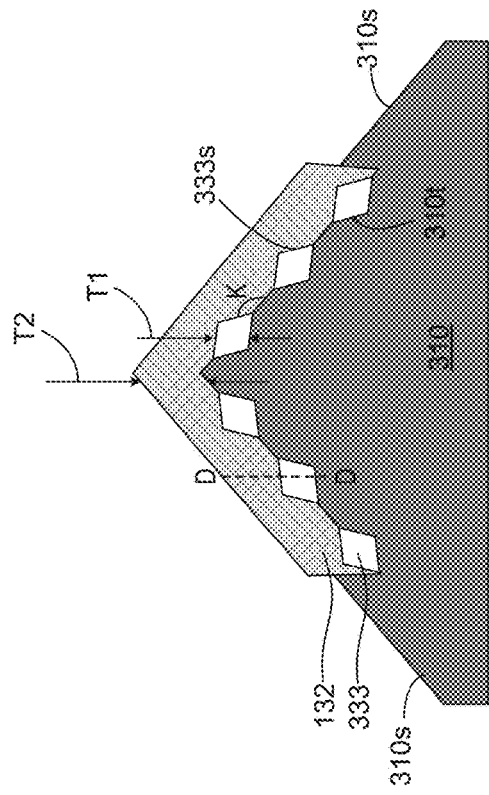

FIGS. 3D-3G illustrate enlarged views of S/D region 310, WFM silicide layer 132, and ZTC layer 333 within region 302 of FIG. 3C with different cross-sectional views of S/D region 310, WFM silicide layer 132, and ZTC layer 333. Surfaces 310s-310t can have a (100) crystal orientation or a (110) crystal orientation when semiconductor material of S/D region 310 is epitaxially grown as a cladding around fin structure 306, as shown in FIGS. 3A-3C. Surface 310s can be the top surface of S/D region 310 and surface 310t can be the surface that forms interface with ZTC layer 333. ZTC layer 333 can have faceted surfaces 333s facing WFM silicide layer 132 and S/D region 310, as shown in FIG. 3D, when formed on S/D region 310 with surfaces 310s-310t having a (100) or (110) crystal orientation. Faceted surfaces 333s form interfaces with WFM silicide layer 132 and S/D region 310. In some embodiments, faceted surfaces 333s can have a (0001) crystal orientation (also referred to as (0001) crystal plane) when formed on surfaces 310s-310t with a (100) crystal orientation (also referred to as (100) crystal plane) and can have a (1120) crystal orientation (also referred to as (1120) crystal plane) when formed on surfaces 310s-310t with a (110) crystal orientation (also referred to as (110) crystal plane). Due to the different crystal orientations between surfaces 310s-310t and 333s, a lattice mismatch ranging from about 1% to about 1.5% can be present between S/D region 310 and ZTC layer 333. In some embodiments, the lattice mismatch can be between about 1.2% and about 1.3% when ZTC layer 333 including $Zr_3Ti_2Si_3$ is formed on Si surfaces 310s-310t with a (100) and a (110) crystal orientation, respectively.

In some embodiments, for adequate reduction of SBH (e.g., SBH ranging from about 0.2 eV to about 0.4 eV) between S/D region 310 and WFM silicide layer 132, ZTC layer 333 can have a thickness T3 along a Z-axis ranging from about 0.1 nm to about 1 nm. Similar to thickness T1, thickness T3 can depend on the concentration of Zr dopants in WFM silicide layer 132 prior to the formation of ZTC layer 333 and the relationship between thickness T3, and the Zr dopant concentration in WFM silicide layer 132 can be represented by the graph of FIG. 1L. In some embodiments, adjacent faceted surfaces 333s facing WFM silicide layer 132 can form an angle H ranging from about 110 degrees to about 130 degrees, as shown in FIG. 3D. In some embodiments, adjacent faceted surfaces 333s facing WFM silicide layer 132 can form an angle J ranging from about 50 degrees to about 70 degrees, as shown in FIG. 3E.

Figure 3F:
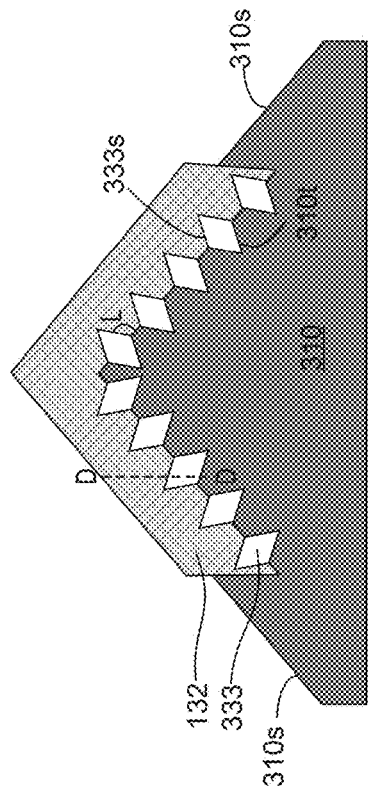
Figure 3E:
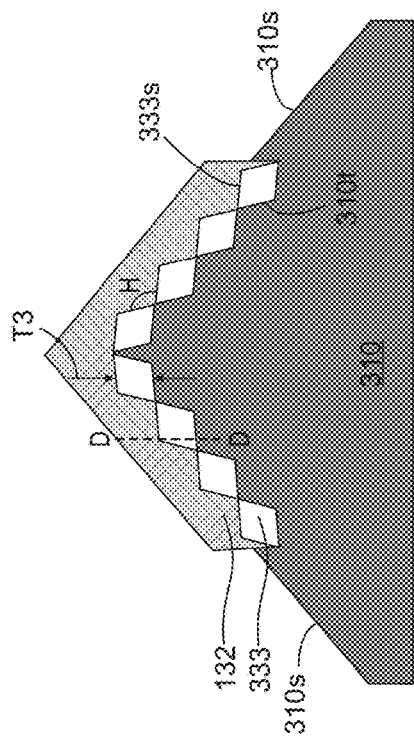
Figure 3G:
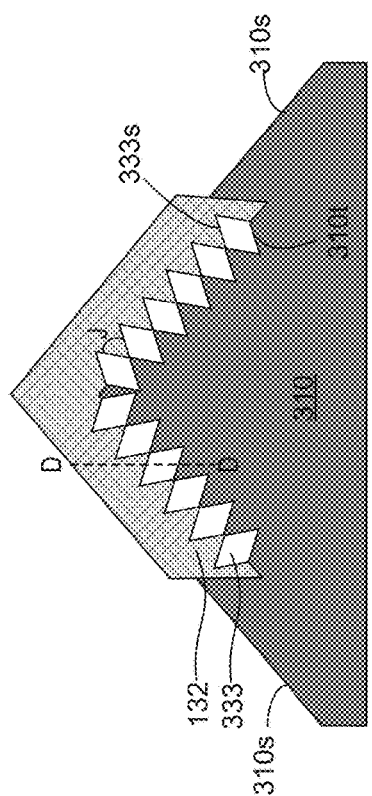

In some embodiments, instead of ZTC layer 333, ZTC clusters 333 with faceted surfaces 333s can be formed at interface 333-310, as shown in FIGS. 3F-3G. In some embodiments, ZTC clusters 333 can be separated from each other at interfaces between WFM silicide layer 132 and S/D region 310 (also referred to herein as "interface 132-310") by a distance ranging from about 0.1 nm to about 2 nm. In some embodiments, faceted surfaces 333s of ZTC clusters 333 can form angles K ranging from about 140 degrees to about 160 degrees with interface 132-310, as shown in FIG. 3F. In some embodiments, faceted surfaces 333s of ZTC clusters 333 can form angles L ranging from about 110 degrees to about 130 degrees with interface 132-310, as shown in FIG. 3G. In some embodiments, interfaces 132-310 can be disposed between adjacent ZTC clusters 333. The discussion of dopant concentration profile along line D-D of FIG. 1E applies to line D-D of FIGS. 3C-3G.

Figure 4A:
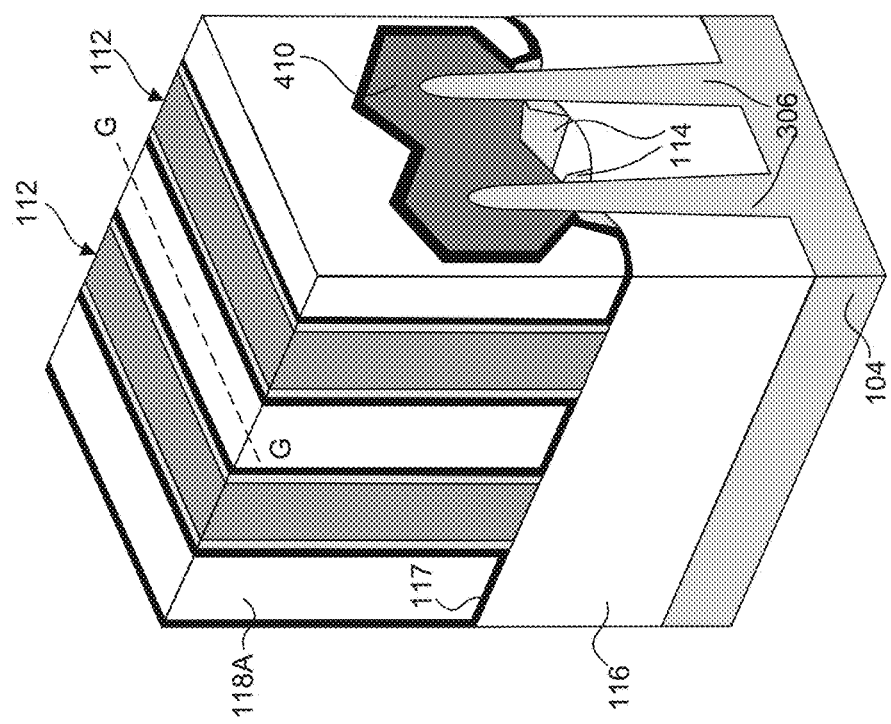
FIGS. 4A-4C illustrate an isometric view and cross-sectional views of a semiconductor device, in accordance with some embodiments.
Figure 4B:
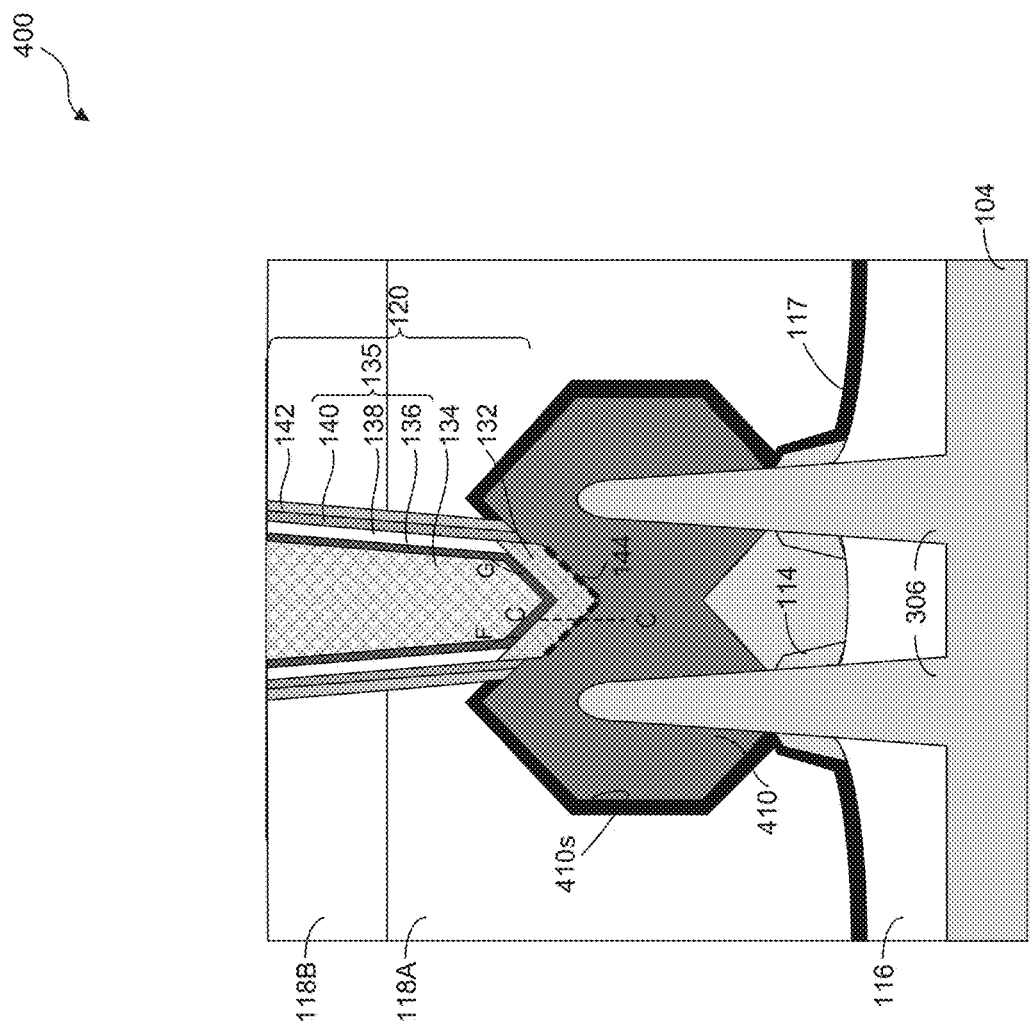
Figure 4C:
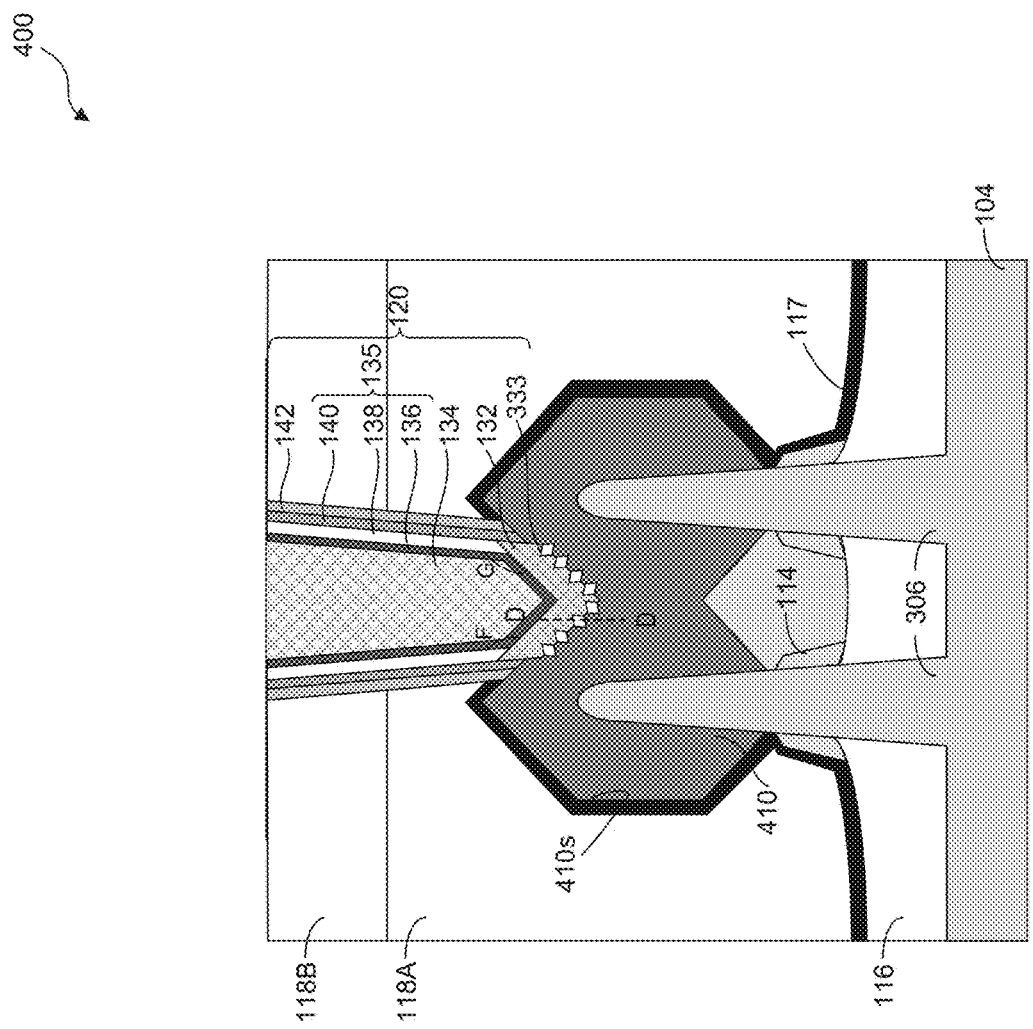

FIG. 4A illustrates an isometric view of a FET 400, according to some embodiments. The discussion of FETs 100 and 300 applies to FET 400, unless mentioned otherwise. FET 400 can have different cross-sectional views, as illustrated in FIGS. 4B-4C, according to some embodiments. FIGS. 4B-4C illustrate cross-sectional views of FET 400 along line G-G of FIG. 4A with additional structures that are not shown in FIG. 4A for simplicity. The cross-sectional views of FIGS. 4B-4C are shown for illustration purposes and may not be drawn to scale. The discussion of elements in FIGS. 1A-1L, 3A-3G, and 4A-4C with the same annotations applies to each other, unless mentioned otherwise.

Referring to FIG. 4A, FET 400 can have merged S/D regions 410 epitaxially grown as cladding around portions of fin structures 306 extending above STI regions 116. The discussion of S/D region 310 applies to merged S/D region 410, unless mentioned otherwise. Referring to FIG. 4B, FET 400 can include S/D structure 120 disposed on merged S/D region 410. In some embodiments, a top surface of WFM silicide layer 132 can be above surfaces 410s (shown in FIG. 4B) or can be substantially coplanar with surfaces 410s (not shown). Dopants of WFM silicide layer 132 can induce the formation of dipole layer 144 at an interface between WFM silicide layer 132 and merged S/D region 410 (also referred to herein as "interface 132-410"). In some embodiments, interface 132-410 can be disposed within S/D region 410 and can be non-coplanar with surfaces 410s. The discussion of dopant concentration profiles along line C-C of FIG. 1C applies to line C-C of FIG. 4B. In some embodiments, S/D contact structure 120 can have a cross-sectional view as shown in FIG. 4C when S/D structure 120 includes ZTC layer 333 or ZTC clusters 333 disposed on merged S/D region 410. Similar to dipole layer 145 of FIG. 3C, dipole layer (not shown in FIG. 4C for simplicity) can be induced at interfaces between ZTC layer 333 and S/D region 410 and interfaces between WFM silicide layer 132 and S/D region 410. The discussion of dopant concentration profile along line D-D of FIG. 1E applies to line D-D of FIG. 4C.

Figure 5:
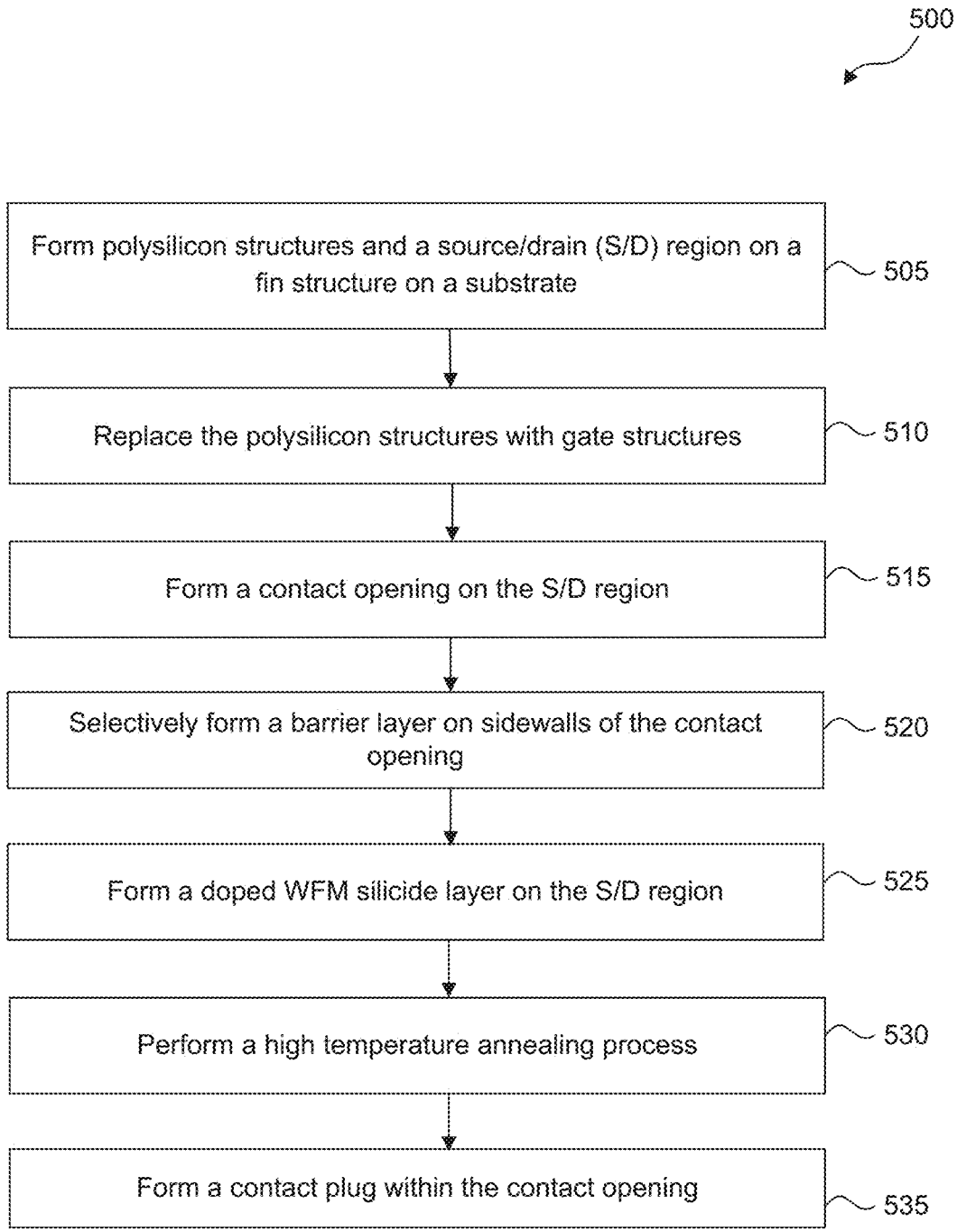
FIG. 5 is a flow diagram of a method for fabricating a semiconductor device with contact structures, in accordance with some embodiments.

FIG. 5 is a flow diagram of an example method 500 for fabricating FET 100, according to some embodiments. For illustrative purposes, the operations illustrated in FIG. 5 will be described with reference to the example fabrication process for fabricating FET 100 as illustrated in FIGS. 6A-17B. FIGS. 6A-17A and 6B-17B are cross-sectional views of FET 100 along respective lines A-A and B-B of FIG. 1A at various stages of fabrication, according to some embodiments. Operations can be performed in a different order or not performed depending on specific applications. It should be noted that method 500 may not produce a complete FET 100. Accordingly, it is understood that additional processes can be provided before, during, and after method 500, and that some other processes may only be briefly described herein. Elements in FIGS. 6A-17B with the same annotations as elements in FIGS. 1A-1L are described above.

Figure 6A:
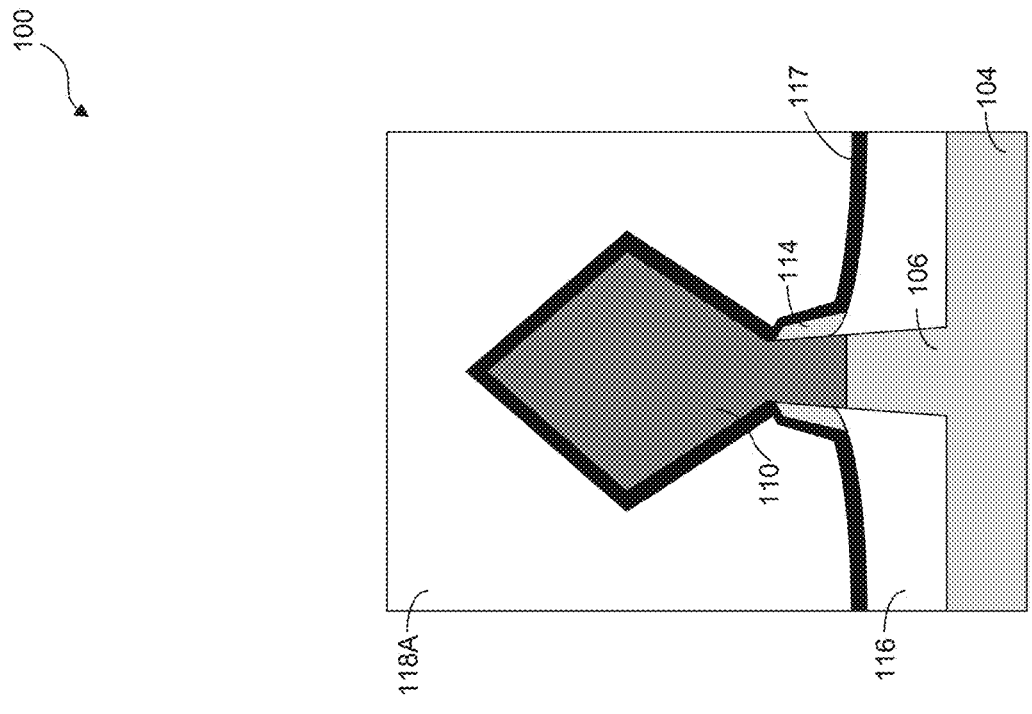
Figure 6B:
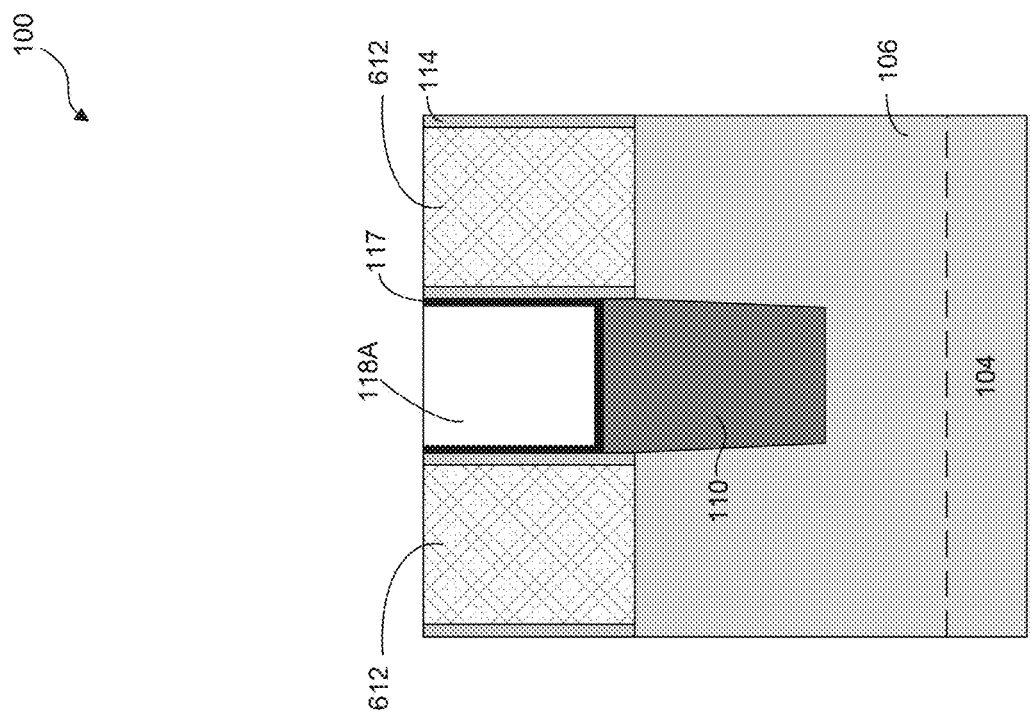

In operation 505, polysilicon structures and a S/D region are formed on a fin structure on a substrate. For example, as shown in FIGS. 6A-6B, polysilicon structures 612 and S/D region 110 are formed on fin structure 106, which are formed on substrate 104. During subsequent processing, polysilicon structures 612 can be replaced in a gate replacement process to form gate structures 112. After the formation of S/D region 110, ESL 117 and ILD layer 118A can be formed to form the structures of FIGS. 6A-6B.

Figures 7A, 7B:
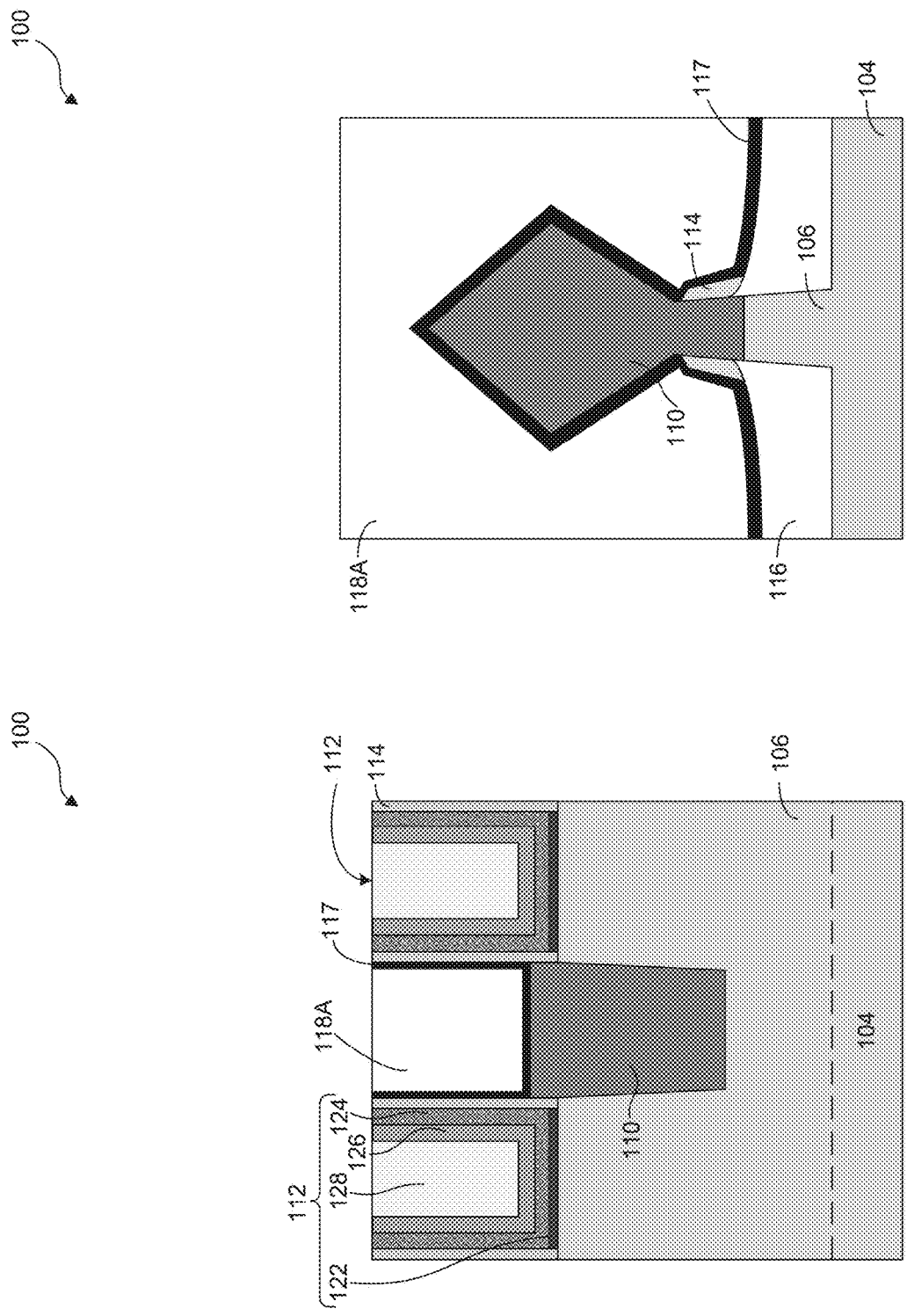
Figure 8B:
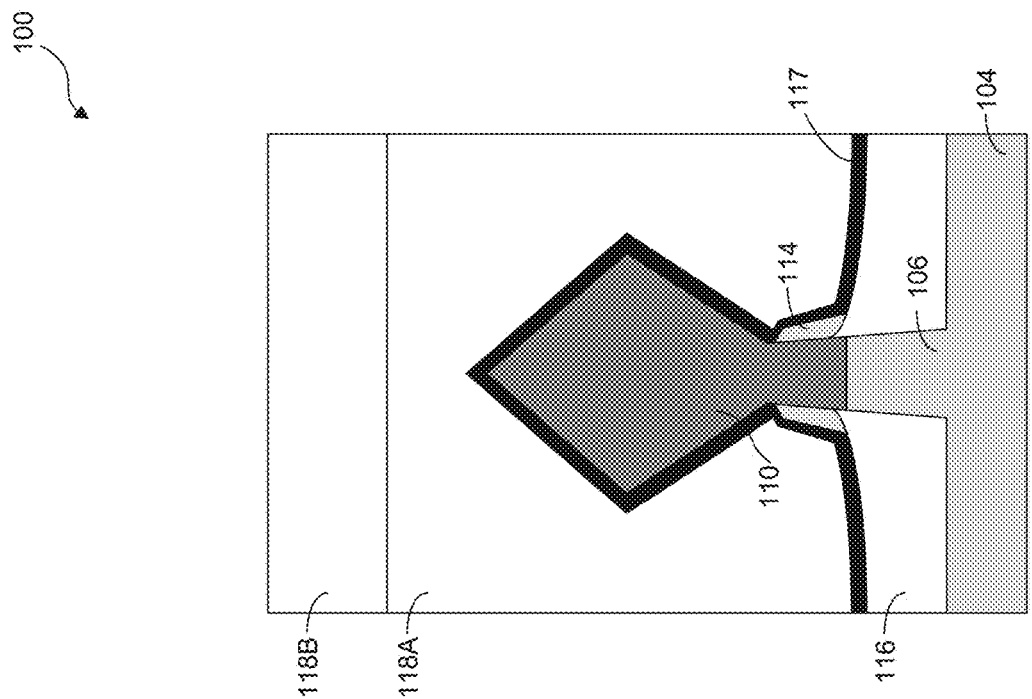
Figure 8A:
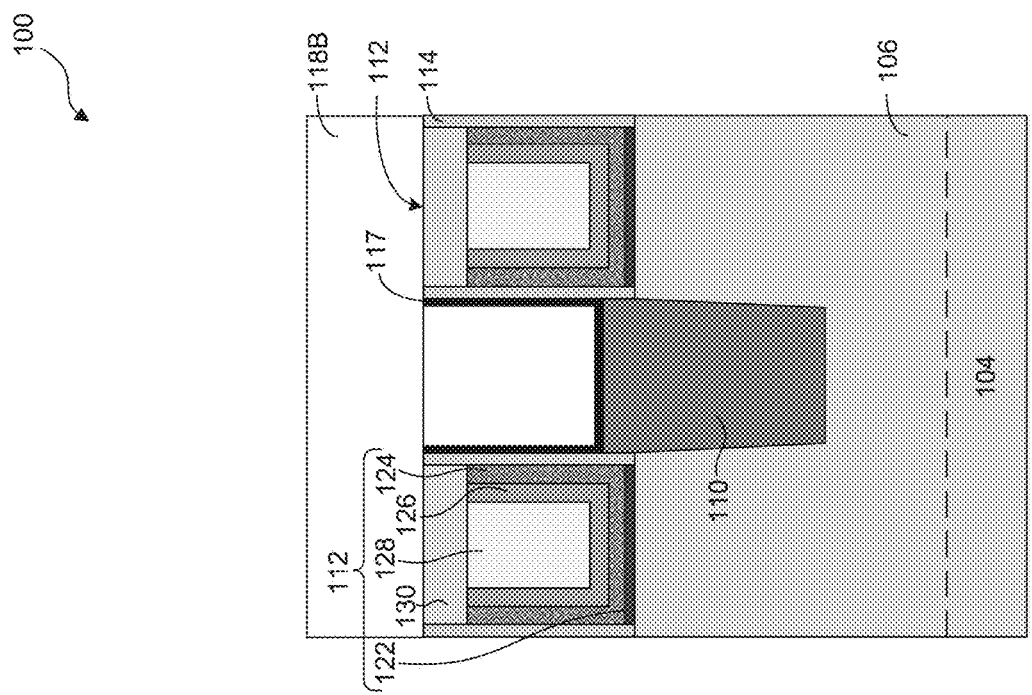
Figures 10A, 10B:
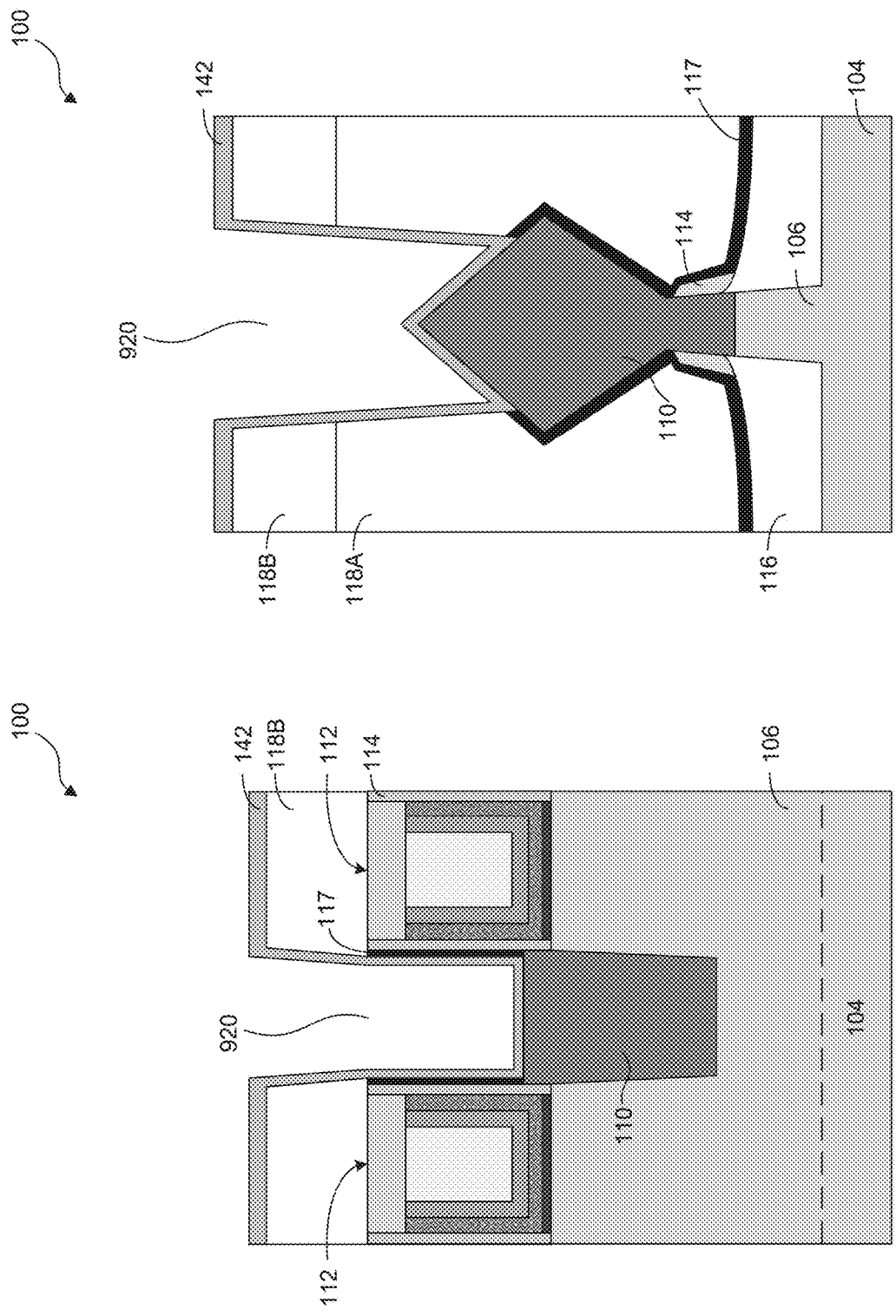
Figures 12A, 12B:
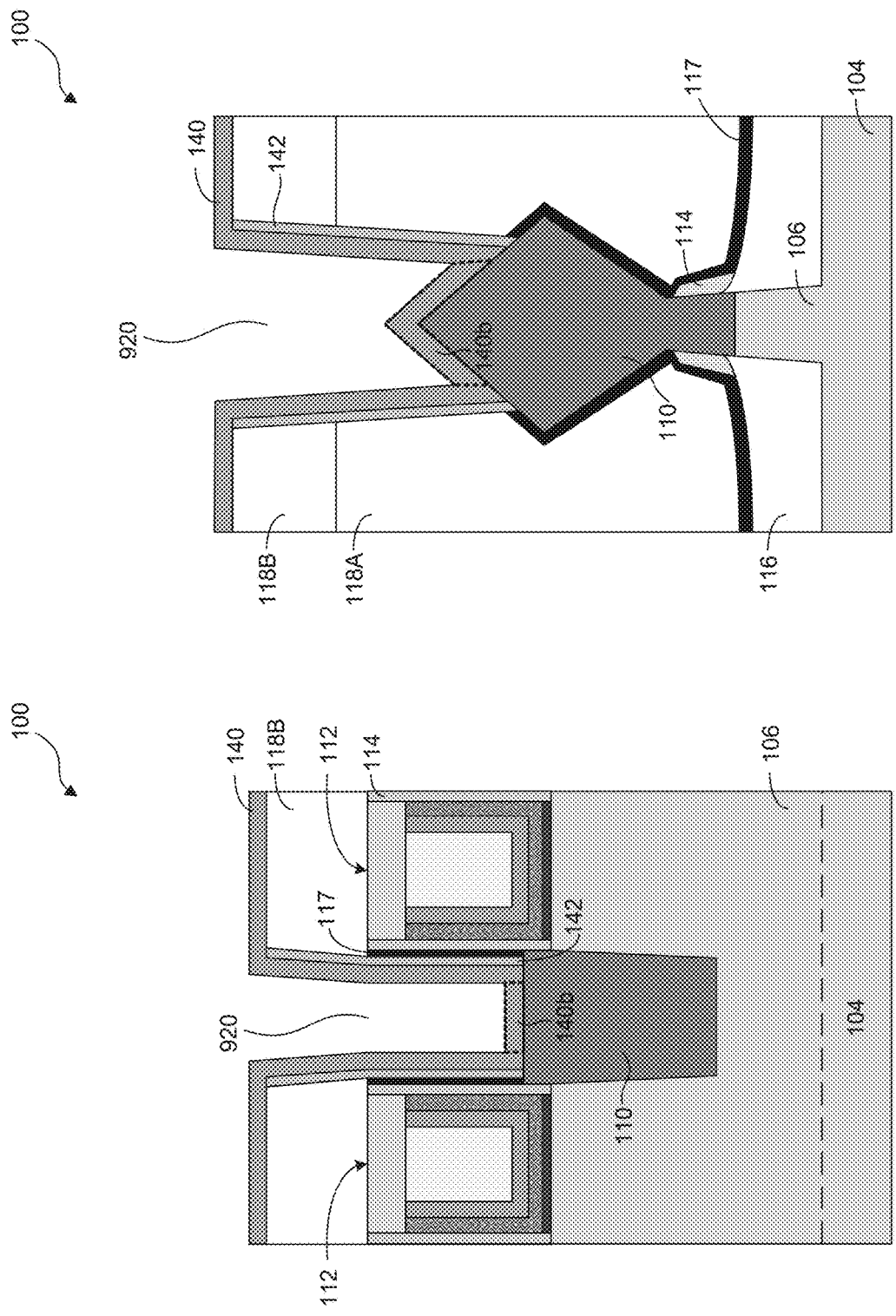
Figure 15A:
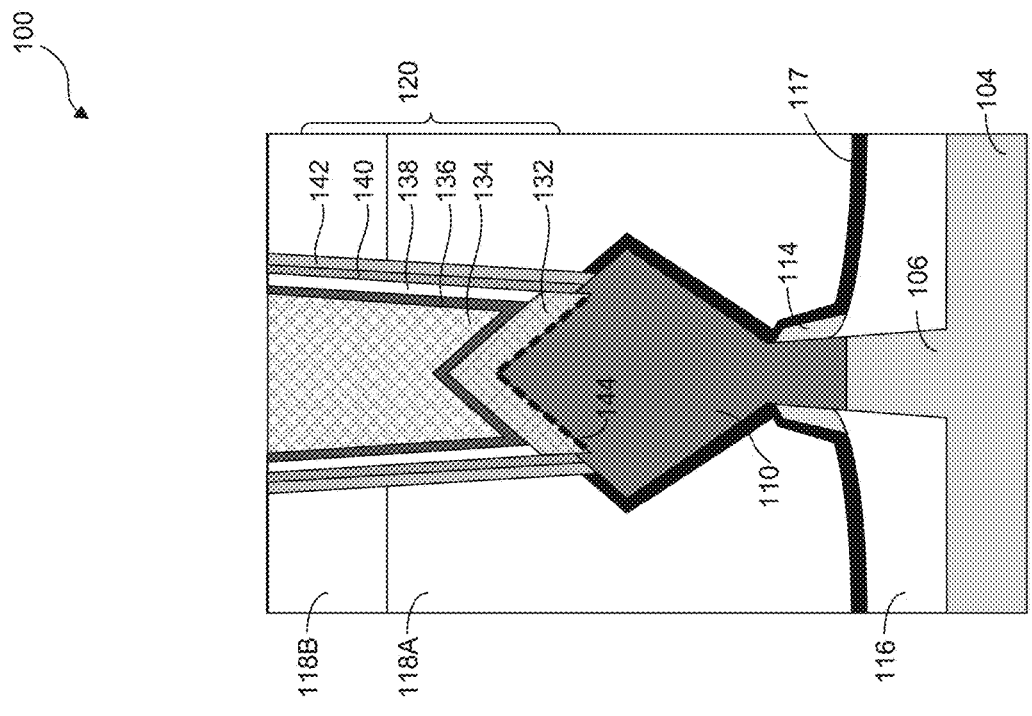
Figure 15B:
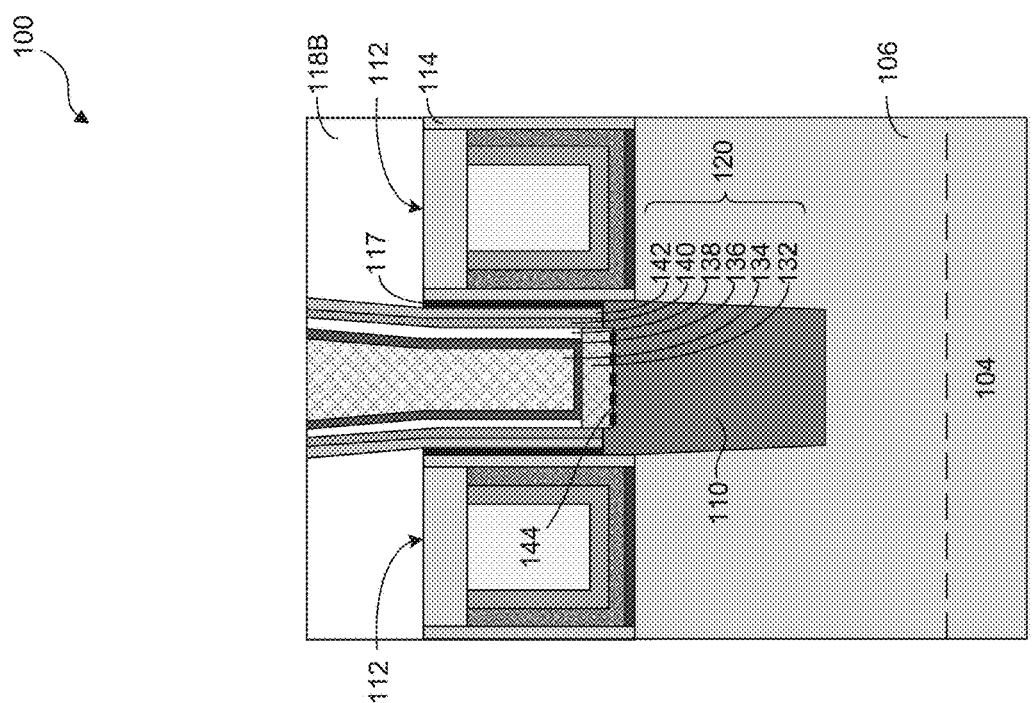

Referring to FIG. 5, in operation 510, polysilicon structures are replaced with gate structures. For example, as shown in FIGS. 7A-7B, polysilicon structures 612 are replaced with gate structures 112. In some embodiments, gate structures 112 can be etched back to form gate capping layers 130, as shown in FIGS. 8A-8B. After the formation of gate capping layers 130, ILD layer 118B can be formed to form the structures of FIGS. 8A-8B.

Referring to FIG. 5, in operation 515, a contact opening is formed on the S/D region. For example, as shown in FIGS. 9A-9B, a contact opening 920 is formed on S/D region 110 by etching portions of ESL 117 and ILD layers 118A-118B on S/D region 110.

Referring to FIG. 5, in operation 520, a barrier layer is selectively formed on sidewalls of the contact opening. For example, as described with respect to FIGS. 10A-10B, barrier layer 142 is selectively formed on sidewalls of contact opening 920. The formation of barrier layer 142 can include sequential operations of (i) depositing a nitride layer 142 (e.g., SiN) on the structures of FIGS. 9A-9B to form the structures of FIGS. 10A-10B and (ii) performing an isotropic etch process to remove portions of nitride layer 142 from top surfaces of ILD layer 118A and S/D region 110 to form the structures of FIGS. 11A-11B.

Referring to FIG. 5, in operation 525, a doped WFM silicide layer is formed on the S/D region. For example, as shown in FIGS. 13A-13B, doped WFM silicide layer 132 is formed on S/D region 110. The formation of doped WFM silicide layer 132 can include sequential operations of (i) performing a cleaning process (e.g., fluorine-based dry etching process) on the structures of FIGS. 11A-11B to remove native oxides from top surfaces of S/D region 110, (ii) depositing a dopant source layer 140 on the cleaned structures of FIGS. 11A-11B to form the structures of FIGS. 12A-12B, and (iii) depositing a WFM layer 138 on the structures of FIGS. 12A-12B to form the structures of FIGS. 13A-13B.

During the deposition of WFM layer 138, the deposition temperature can cause the bottom portion 140b (shown in FIGS. 12A-12B) of dopant source layer 140 to thermally decompose and the atoms of the thermally decomposed bottom portions 140b to diffuse into the overlying WFM layer 138 as dopant atoms. In some embodiments, the deposition temperature can cause sidewall surface portions of dopant source layer 140 facing WFM layer 138 to thermally decompose and diffuse into the overlying WFM layer 138 as dopant atoms. The remaining sidewall portions of dopant source layer 140 can become oxidized. The dopant atoms can induce the formation of dipole layer 144 and can have concentration profile 146 or 148 across lines C-C, as described with reference to FIG. 1J. The deposition temperature can also initiate silicidation reaction between the doped bottom portion of WFM layer 138 (not shown) within contact opening 920 and S/D region 110 to form WFM silicide layer 132, as shown in FIGS. 13A-13B.

In some embodiments, the deposition of dopant source layer 140 can include depositing a transition metal, which has an electronegativity value smaller than the electronegativity value of the metal of WFM layer 138 using a CVD process or an ALD process at a temperature ranging from about 300° C. to about 500° C. In some embodiments, dopant source layer 140 can include a transition metal, such as Zr, Hf, Yb, Y, Er, Ce, Sc, and a combination thereof. For effective and complete thermal decomposition of bottom portion 140b of dopant source layer 140, in some embodiments, dopant source layer 140 can be deposited with a thickness ranging from about 0.05 nm to about 0.5 nm.

In some embodiments, the deposition of WFM layer 138 can include depositing a metal with a work function value closer to a conduction band-edge energy than a valence band-edge energy of the material of S/D region 110 for NFET 100 or depositing a metal with a work function value closer to a valence band-edge energy than a conduction band-edge energy of the material of S/D region 110 for PFET 100 using a CVD process or an ALD process at a temperature ranging from about 300° C. to about 500° C. In some embodiments, for NFET 100, WFM layer 138 can include Ti, Ta, Mo, Zr, Hf, Sc, Y, Ho, Tb, Gd, Lu, Dy, Er, Yb, or a combination thereof, and for PFET 100, WFM layer 138 can include Ni, Co, Mn, W, Fe, Rh, Pd, Ru, Pt, Ir, Os, or a combination thereof.

Referring to FIG. 5, in operation 530, a high temperature annealing process is performed. For example, a thermal annealing process can be performed on the structures of FIGS. 13A-13B in an $N_2$ ambient at a temperature ranging from about 500° C. to about 800° C. using a rapid thermal annealing (RTA) process, a spike annealing process, or a laser annealing process for a time period ranging from about 100 nanoseconds to about 100 microseconds. After the thermal annealing process, the dopant atoms can have concentration profile 150 across lines C-C (FIGS. 13A-13B) if the dopant atoms in WFM silicide layer 132 include a non-Zr-based transition metal, as described with reference to FIGS. 1A-1C and 1J. On the other hand, if the dopant atoms include Zr metal, the structures of FIGS. 14A-14B can be formed with Zr concentration profile 158 across lines D-D, as described with reference to FIGS. 1D-1E and 1K, after the thermal annealing process is performed on the structures of FIGS. 13A-13B. The thermal annealing process can improve the quality of WFM silicide layer 132 and interfaces 132-110, and as a result, reduce contact resistance between WFM silicide layer 132 and S/D region 110.

In some embodiments, a nitride capping layer (not shown) can be formed on the structures of FIGS. 13A-13B after the formation of WFM silicide layer 132 and prior to the thermal annealing process. The nitride capping layer can form nitride capping layer 136 in subsequent processing. The formation of nitride capping layer can include depositing a layer of metal, such as Ti and Ta on the structures of FIGS. 13A-13B and performing a nitridation process using ammonia ($NH_3$) gas on the layer of metal.

Referring to FIG. 5, in operation 535, a contact plug is formed within the contact opening. For example, as shown FIGS. 15A-15B, contact plug 134 is formed within contact opening 920. The formation of contact plug 134 can include filling contact opening 920 in the structures of FIGS. 13A-13B with a conductive material and performing a CMP process to form the structures of FIGS. 15A-15B. The CMP process can substantially coplanarize top surfaces of contact structure 120 with the top surface of ILD layer 118B.

Figure 16B:
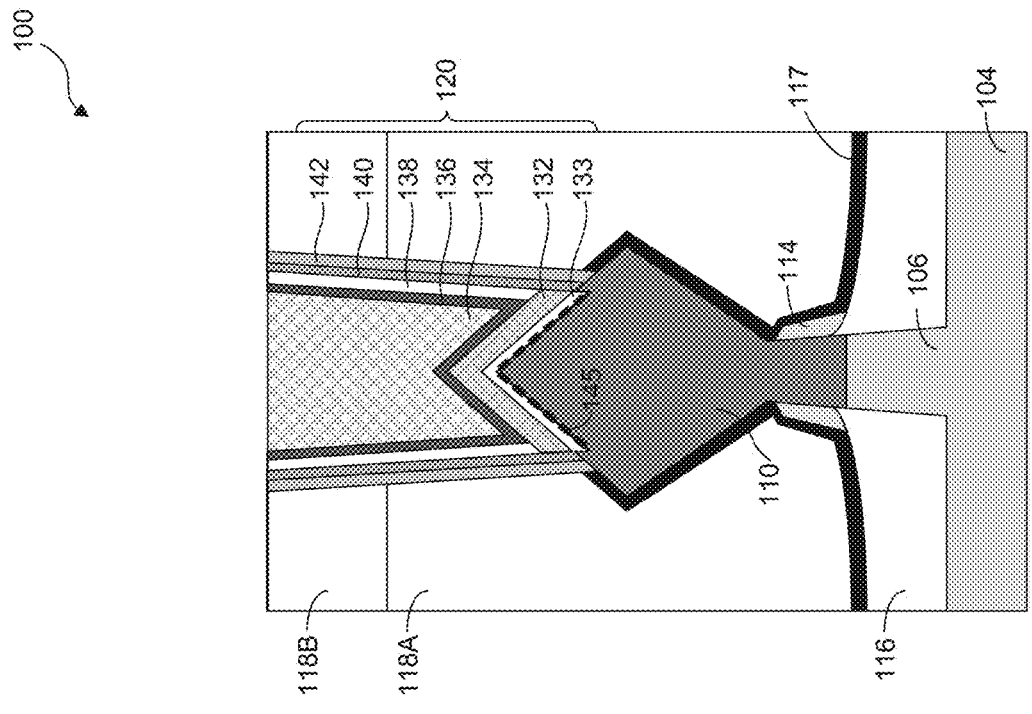
Figure 16A:
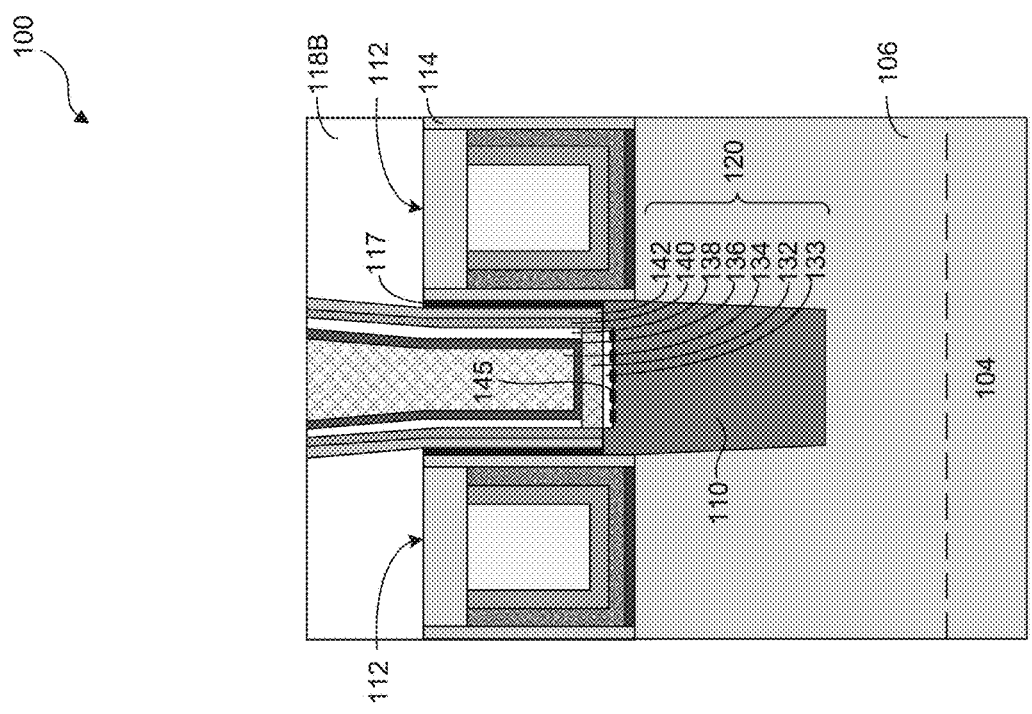

In some embodiments, contact plug 134 can be formed by filling contact opening 920 in the structures of FIGS. 14A-14B, instead of FIGS. 13A-13B, followed by the CMP process to form the structures of FIGS. 16A-16B. In some embodiments, the stack of metal-based liners 135 can be removed from the structures of FIGS. 13A-13B prior to filling contact opening 920 with the conductive material and performing the CMP process to form the structures of FIGS. 17A-17B.

In some embodiments, operations 515-535 can be performed on S/D regions 210, 310, and 410 of respective FETs 200, 300, and 400, instead of S/D region 110 to form the structures of FIGS. 2B-2C, 3B-3C, and 4B-4C.

The present disclosure provides example structures and methods for reducing contact resistance between source/drain (S/D) regions (e.g., S/D regions 110, 210, 310, and 410) and S/D contact structures (e.g., S/D contact structure 120) of FETs (e.g. FET 100, 200, 300, and 400). In some embodiments, dipole layers (e.g., dipole layers 144 and 145) and/or ternary compound layers (e.g., ZTC layers 133 and 333) can be formed at interfaces between the S/D regions and the S/D contact structures to reduce the SBHs between the S/D regions and the S/D contact structures. The dipole layers and/or ternary compound layers can be formed by doping the silicide layers (e.g., WFM silicide layer 132) of the S/D contact structures with metals having electronegativity values lower than the metals of the silicide layers. The metal dopants can induce the formation of dipoles between the metal dopants and the semiconductor elements of the S/D regions. The metal dopants can also induce the formation of a ternary compound between the metal dopants, the metal of the silicide layers, and the semiconductor elements of the S/D regions. The formation of such interfacial dipole layers and/or ternary compound layers can reduce the contact resistances of the FETs by about 50% to about 70% compared to FETs without the interfacial dipole layers and/or ternary compound layers, and consequently improve the performance of the FETs.

In some embodiments, a semiconductor device includes a substrate, a fin structure disposed on the substrate, a gate structure disposed on the fin structure, a source/drain (S/D) region disposed adjacent to the gate structure, a contact structure disposed on the S/D region, and a dipole layer disposed at an interface between the ternary compound layer and the S/D region. The contact structure includes a ternary compound layer disposed on the S/D region, a work function metal (WFM) silicide layer disposed on the ternary compound layer, and a contact plug disposed on the WFM silicide layer.

In some embodiments, a semiconductor device includes a gate structure disposed on first and second fin structures, a merged source/drain (S/D) region disposed on the first and second fin structures, and a contact structure disposed on the merged S/D region. The contact structure includes ternary compound clusters disposed on the merged S/D region, a work function metal (WFM) silicide layer disposed on the ternary compound clusters and the merged S/D region, and a contact plug disposed on the WFM silicide layer.

In some embodiments, a method includes forming a fin structure on a substrate, forming a source/drain (S/D) region on the fin structure, forming a contact opening on the S/D region, forming a doped work function metal (nWFM) silicide layer within the contact opening, forming a ternary compound layer between the doped WFM silicide layer and the S/D region, and forming a contact plug within the contact opening.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate;
    a fin structure disposed on the substrate;
    a gate structure disposed on the fin structure;
    a source/drain (S/D) region disposed adjacent to the gate structure;
    a contact structure disposed on the S/D region, wherein the contact structure comprises a ternary compound layer disposed on the S/D region, a work function metal (WFM) silicide layer disposed on the ternary compound layer, and a contact plug disposed on the WFM silicide layer; and
    a dipole layer disposed at an interface between the ternary compound layer and the S/D region.

2. The semiconductor device of claim 1, wherein the dipole layer comprises a dopant atom of the WFM silicide layer and a semiconductor atom of the S/D region.

3. The semiconductor device of claim 1, wherein the ternary compound layer comprises a zirconium-based ternary compound.

4. The semiconductor device of claim 1, wherein a first surface of the S/D region facing the ternary compound layer comprises a (111) crystal orientation, and
    wherein a second surface of the ternary compound layer facing the WFM silicide layer comprises an unfaceted surface.

5. The semiconductor device of claim 1, wherein the ternary compound layer is a discontinuous layer, and
    wherein a surface of the S/D region facing the ternary compound layer comprises a (111) crystal orientation.

6. The semiconductor device of claim 1, wherein a first surface of the S/D region facing the ternary compound layer comprises a (100) or a (110) crystal orientation, and
    wherein a second surface of the ternary compound layer facing the WFM silicide layer comprises a faceted surface.

7. The semiconductor device of claim 1, wherein the WFM silicide layer comprises metal dopants with an electronegativity value smaller than an electronegativity value of a metal in a metal silicide of the WFM silicide layer.

8. The semiconductor device of claim 1, wherein the contact structure further comprises a liner along sidewalls of the contact plug, and
    wherein the liner comprises a metal or an oxide of a metal of the dipole layer.

9. The semiconductor device of claim 1, wherein the contact structure further comprises a liner along sidewalls of the contact plug, and
    wherein the liner comprises a metal or an oxide of a metal of the WFM silicide layer.

10. The semiconductor device of claim 1, wherein the contact structure further comprises a capping layer disposed on the WFM silicide layer.

11. A semiconductor device, comprising:
    a gate structure disposed on a substrate;
    a source/drain (S/D) region disposed on the substrate; and
    a contact structure, disposed on the S/D region, comprising:
        a zirconium-based layer disposed on the S/D region;
        a doped silicide layer disposed on the zirconium-based layer and the S/D region, wherein the doped silicide layer comprises transition metal dopants; and
        a contact plug disposed on the doped silicide layer.

12. The semiconductor device of claim 11, wherein the zirconium-based layer comprises a zirconium-based ternary compound.

13. The semiconductor device of claim 11, wherein the zirconium-based layer comprises faceted surfaces.

14. The semiconductor device of claim 11, wherein the zirconium-based layer comprises a metal of the doped silicide layer.

15. The semiconductor device of claim 11, further comprising a dipole layer disposed between the doped silicide layer and the S/D region.

16. The semiconductor device of claim 11, further comprising a dipole layer disposed at an interface between the zirconium-based layer and the S/D region.

17. A semiconductor device, comprising:
    a fin structure disposed on a substrate;
    a source/drain (S/D) region disposed on the fin structure; and
    a contact structure, comprising:
        a first silicide layer, disposed on the S/D region, comprising:
            a first metal,
            a second metal different from the first metal, and
            a faceted surface;
        a second silicide layer comprising the second metal disposed on the first silicide layer, wherein the faceted surface is in contact with the second silicide layer; and
        a contact plug disposed on the second silicide layer.

18. The semiconductor device of claim 17, wherein the first silicide layer comprises zirconium and titanium.

19. The semiconductor device of claim 17, further comprising a dipole layer disposed at an interface between the first silicide layer and the S/D region.

20. The semiconductor device of claim 17, further comprising a nitride capping layer disposed on the second silicide layer.

* * * * *